US011862535B2

(12) United States Patent
Shih et al.

(10) Patent No.: US 11,862,535 B2
(45) Date of Patent: Jan. 2, 2024

(54) THROUGH-SUBSTRATE-VIA WITH REENTRANT PROFILE

(71) Applicant: Taiwan Semiconductor Manufacturing Co., Ltd., Hsinchu (TW)

(72) Inventors: Hung-Ling Shih, Tainan (TW); Wei Chuang Wu, Tainan (TW); Shih Kuang Yang, Tainan (TW); Hsing-Chih Lin, Tainan (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 284 days.

(21) Appl. No.: 17/177,660

(22) Filed: Feb. 17, 2021

(65) Prior Publication Data
US 2022/0084908 A1 Mar. 17, 2022

Related U.S. Application Data

(60) Provisional application No. 63/079,003, filed on Sep. 16, 2020.

(51) Int. Cl.
*H01L 23/48* (2006.01)
*H01L 23/522* (2006.01)
(Continued)

(52) U.S. Cl.
CPC .......... *H01L 23/481* (2013.01); *H01L 21/308* (2013.01); *H01L 21/76804* (2013.01);
(Continued)

(58) Field of Classification Search
CPC ... H01L 23/481; H01L 23/5226; H01L 24/05; H01L 21/76898; H01L 21/76831; H01L 21/308
See application file for complete search history.

(56) References Cited

U.S. PATENT DOCUMENTS 9,219,032 B2   12/2015  Ramachandran et al.
9,449,913 B2    9/2016  Lee et al.
(Continued)

FOREIGN PATENT DOCUMENTS

CN    115274616 A    11/2022
JP    2005294338 A   10/2005
JP    2019160911 A    9/2019

*Primary Examiner* — Jaehwan Oh
*Assistant Examiner* — John M Parker
(74) *Attorney, Agent, or Firm* — Eschweiler & Potashnik, LLC

(57) ABSTRACT

The present disclosure relates an integrated chip. The integrated chip includes a semiconductor device arranged along a first side of a semiconductor substrate. The semiconductor substrate has one or more sidewalls extending from the first side of the semiconductor substrate to an opposing second side of the semiconductor substrate. A dielectric liner lines the one or more sidewalls of the semiconductor substrate. A through-substrate-via (TSV) is arranged between the one or more sidewalls and is separated from the semiconductor substrate by the dielectric liner. The TSV has a first width at a first distance from the second side and a second width at a second distance from the second side. The first width is smaller than the second width and the first distance is smaller than the second distance.

20 Claims, 19 Drawing Sheets

(51) Int. Cl.
*H01L 21/308* (2006.01)
*H01L 21/768* (2006.01)

(52) U.S. Cl.
CPC .. *H01L 21/76831* (2013.01); *H01L 21/76898* (2013.01); *H01L 23/5226* (2013.01)

(56) References Cited

U.S. PATENT DOCUMENTS

| | | | |
|---|---|---|---|
| 2011/0006428 A1* | 1/2011 | Lo | H01L 21/76898 257/751 |
| 2014/0054774 A1 | 2/2014 | Uchida et al. | |
| 2015/0311129 A1 | 10/2015 | Miller et al. | |
| 2016/0155685 A1* | 6/2016 | Chen | H01L 21/76898 257/762 |
| 2020/0006128 A1* | 1/2020 | Weng | H01L 23/5226 |
| 2020/0075458 A1 | 3/2020 | Lee et al. | |
| 2020/0144158 A1 | 5/2020 | Seo et al. | |
| 2021/0005533 A1* | 1/2021 | Cho | H01L 21/0217 |

* cited by examiner

THROUGH-SUBSTRATE-VIA WITH REENTRANT PROFILE

REFERENCE TO RELATED APPLICATION

This Application claims the benefit of U.S. Provisional Application No. 63/079,003, filed on Sep. 16, 2020, the contents of which are hereby incorporated by reference in their entirety.

BACKGROUND

Through-substrate-vias (TSVs) are conductive electrical connections that pass through a substrate (e.g., a silicon substrate) to couple a conductive feature on a first side of a substrate to a conductive feature on an opposing second side of the substrate. TSVs are used in many modern day integrated chips. For example, TSVs are used in multi-dimensional chips (e.g., 3DIC) to electrically couple vertically stacked integrated chip die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
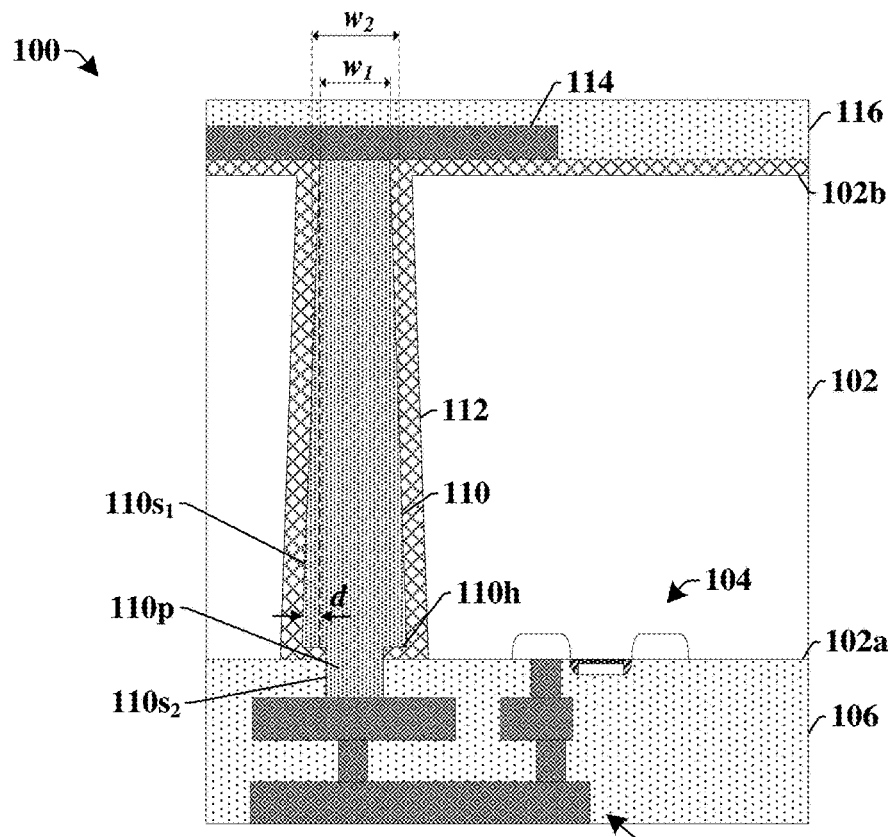
FIG. 1 illustrates a cross-sectional view of some embodiments of an integrated chip having a through-substrate-via (TSV) with a reentrant profile.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (IC) with image sensors are used in a wide range of modern day electronic devices, such as cell phones and computers, for example. Complementary metal-oxide semiconductor (CMOS) image sensors (CIS) have become popular types of IC image sensors. Compared to charge-coupled devices (CCD), CIS have low power consumption, small size, fast data processing, a direct output of data, and low manufacturing cost. Some types of CMOS image sensors include front-side illuminated CMOS image sensors (FSI-CIS) and back-side illuminated CMOS image sensors (BSI-CIS).

BSI-CIS comprise a plurality of interconnects arranged within an inter-level dielectric (ILD) structure disposed along a front-side of a substrate. A plurality of micro-lenses are arranged along an opposing back-side of the substrate, which is configured to receive incident light. A bond pad may also be arranged along the back-side of the substrate. The bond pad is electrically coupled to the plurality of interconnects by way of a conductive through-substrate-via (TSV) that extends through the substrate. The TSV may be formed by performing a first etching process on the back-side of the substrate. The first etching process forms an intermediate TSV hole that extends through the substrate and that is defined by sidewalls of the substrate and a horizontally extending surface of the ILD structure. A dielectric liner is subsequently formed along the sidewalls of the substrate and the horizontally extending surface of the ILD structure. A second etching process is then performed to vertically etch through a horizontally extending surface of the dielectric liner and the ILD structure. The second etching process forms a TSV hole that exposes a first interconnect of the plurality of interconnects. A conductive material is subsequently formed in the TSV hole to define the TSV.

It has been appreciated that in addition to etching the horizontally extending surface of the dielectric liner, the second etching process may also etch sidewalls of the dielectric liner, resulting in damage to the dielectric liner and/or sidewalls of the substrate. For example, the second etching process can thin or break-through the dielectric liner, so that the subsequently formed TSV is insufficiently insulated from the substrate, thereby decreasing a reliability of the integrated chip and/or leading to failure of the integrated chip.

The present disclosure, in some embodiments, relates to an integrated chip having a through-substrate-via (TSV) with a reentrant profile that is configured to prevent damage to a dielectric liner. In some embodiments, the integrated chip is formed by performing a first etching process on a back-side of a substrate. The first etching process forms an intermediate TSV hole that extends through the substrate and that has a width that increases as a distance from the back-side of the substrate increases. A dielectric liner is formed on sidewalls of the substrate and a horizontally extending surface of an inter-level dielectric (ILD) structure (on a front-side of the substrate) that define the intermediate TSV hole. A second etching process is subsequently performed to form a TSV hole that exposes an interconnect within the ILD structure by etching through a horizontally extending surface of the dielectric liner and the ILD structure. Because a width of the intermediate TSV hole increases as a distance from the back-side of the substrate increases, sidewalls of the dielectric liner are laterally set back from an opening of the intermediate TSV hole along the back-side of the substrate. Laterally separating the sidewalls of the dielectric liner from the opening allows for the sidewall of the dielectric liner to be protected from an etchant of the second etching process and thereby mitigates damage to the dielectric liner and improves a reliability of the integrated chip.

FIG. 1 illustrates a cross-sectional view of some embodiments of an integrated chip 100 having a through-substrate-via (TSV) with a reentrant profile.

The integrated chip 100 comprises a substrate 102 having a first side 102a (e.g., a front-side) and a second side 102b (e.g., a back-side) opposing the first side 102a. In some embodiments, one or more semiconductor devices 104 are disposed along or within the first side 102a of the substrate 102. In various embodiments, the one or more semiconductor devices 104 may comprise a transistor device (e.g., a MOSFET, a BJT, a FinFET, or the like), an image sensor device (e.g., a photodiode, a PIN photodiode, or the like), and/or the like. An inter-level dielectric (ILD) structure 106 is disposed on the first side 102a of the substrate 102. The ILD structure 106 surrounds a plurality of interconnects 108. In some embodiments, the plurality of interconnects 108 may be coupled to the one or more semiconductor devices 104. A conductive feature 114 is disposed within a dielectric structure 116 arranged along the second side 102b of the substrate 102. In various embodiments, the conductive feature 114 may comprise an interconnect, a redistribution layer, a bond pad, or the like.

A TSV 110 extends through the substrate 102 and between one of the plurality of interconnects 108 and the conductive feature 114. The TSV 110 comprises a conductive material, such as copper, aluminum, or the like. In some embodiments, the TSV 110 may comprise a back-side through-substrate-via (BTSV), which is formed by etching a TSV hole into the second side 102b (e.g., a back-side) of the substrate 102. The TSV 110 has a width that increases as a distance from the second side 102b of the substrate 102 increases. For example, the TSV 110 may have a first width $w_1$ along the second side 102b of the substrate 102 and a second width $w_2$, which is larger than the first width $w_1$, between the first side 102a of the substrate 102 and the second side 102b of the substrate 102. In some embodiments, the TSV 110 further comprises a protrusion 110p extending outward from a horizontally extending surface 110h to one of the plurality of interconnects 108. In such embodiments, the horizontally extending surface 110h is vertically between a first sidewall $110s_1$ and a second sidewall $110s_2$ of the TSV 110. In some embodiments, the protrusion 110p physically contacts one of the plurality of interconnects 108.

The TSV 110 is separated from the substrate 102 by way of a dielectric liner 112. The dielectric liner 112 extends along one or more sidewalls of the substrate 102. In some embodiments, the dielectric liner 112 may continuously extend from the one or more sidewalls of the substrate 102 to over the second side 102b of the substrate 102. The dielectric liner 112 has sidewalls that are angled so that a distance between the sidewalls increases as a distance from the second side 102b of the substrate 102 increases. The angle of the sidewalls causes the sidewalls to be laterally separated from outermost edges of a top surface of the TSV 110 facing the conductive feature 114. For example, in some embodiments, outer edges of the top surface of the TSV 110 may be laterally separated from the sidewalls of the dielectric liner 112 by a distance d that is measured along a lateral direction that is parallel to the first side 102a of the substrate 102. In some embodiments, the distance d is between approximately 10 nm (nanometers) and approximately 200 nm, between approximately 25 nm and approximately 150 nm, or other similar values.

Because the sidewalls of the dielectric liner 112 are separated (e.g., set back) from outermost edges of the top surface of the TSV 110, the sidewalls of the dielectric liner 112 and/or substrate 102 overhang the TSV 110. During fabrication of the integrated chip 100, the overhang of the dielectric liner 112 and/or substrate 102 limits an amount of etchant that reaches sidewalls of the dielectric liner 112. By limiting an amount of etchant that reaches sidewalls of the dielectric liner 112, damage to the sidewalls of the dielectric liner 112 is mitigated and a reliability of the integrated chip 100 is improved.

Figure 2:
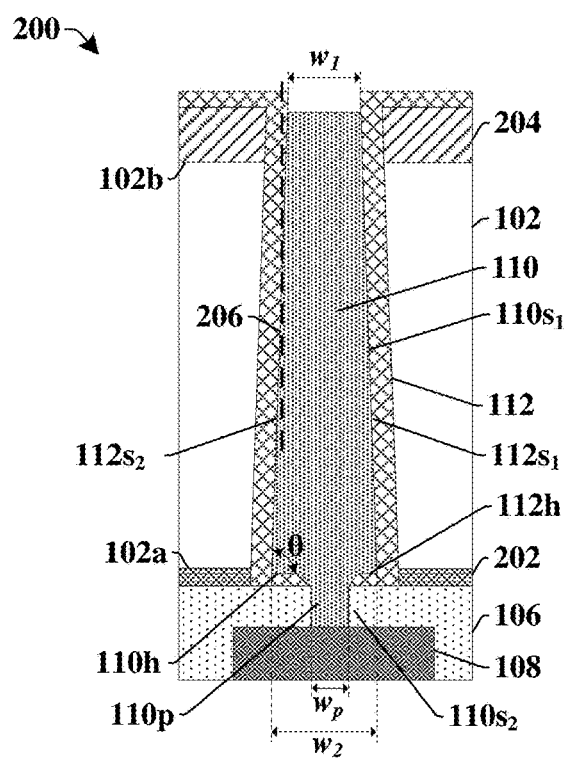
FIG. 2 illustrates a cross-sectional view of some additional embodiments of an integrated chip having a TSV with a reentrant profile.

FIG. 2 illustrates a cross-sectional view of some additional embodiments of an integrated chip 200 having a TSV with a reentrant profile.

The integrated chip 200 comprises a substrate 102 having a first side 102a and a second side 102b opposing the first side 102a. In some embodiments, the substrate 102 may comprise or be a semiconductor substrate (e.g., a silicon substrate, a silicon wafer, or the like). A contact etch stop layer 202 is disposed along the first side 102a of the substrate 102. In some embodiments, an ILD structure 106 is disposed on the contact etch stop layer 202. The ILD structure 106 may comprise a plurality of stacked ILD layers. A plurality of interconnects 108 are disposed within the ILD structure 106. The plurality of interconnects 108 may comprise a middle-end-of-the-line (MOL) interconnect, a conductive contact, an interconnect wire, or an interconnect via. A dielectric layer 204 is disposed on the second side 102b of the substrate 102. In various embodiments, the dielectric layer 204 may comprise a nitride (e.g., silicon nitride, silicon oxynitride, etc.), an oxide (e.g., silicon oxide, etc.), or the like A TSV 110 extends through the substrate 102, the dielectric layer 204, the contact etch stop layer 202, and the ILD structure 106. A dielectric liner 112 is arranged between the TSV 110 and the substrate 102. In some embodiments, the dielectric liner 112 further extends between the TSV 110 and the contact etch stop layer 202 and/or the dielectric layer 204. In some embodiments, the dielectric liner 112 may continuously extend from along one or more sidewalls of the substrate 102 to over the dielectric layer 204. In some embodiments, the dielectric liner 112 has a substantially constant thickness along the one or more sidewalls of the substrate 102, the contact etch stop layer 202, and/or the dielectric layer 204. In some embodiments, the dielectric liner 112 may have a thickness in a range of between approximately 50 nanometers (nm) and approximately 150 nm, between approximately 50 nm and approximately 100 nm, between approximately 60 nm and approximately 80 nm, or other similar values. Having a dielectric liner 112 with a thickness of less than approximately 150 nm provides for the TSV 110 with a sufficient width to provide for a good electrical connection.

The dielectric liner 112 has a first sidewall $112s_1$ and a second sidewall $112s_2$ facing the TSV 110. A horizontally extending ledge 112h protrudes outward from the first sidewall $112s_1$ and towards the second sidewall $112s_2$. The first sidewall $112s_1$ is angled so that the first sidewall $112s_1$ is separated from the horizontally extending ledge 112h by a first angle θ measured through the TSV 110. In various embodiments, the first angle θ is between approximately 80° and approximately 90°. In other embodiments, the first angle θ may be between approximately 85° and approximately 88°, between approximately 82° and approximately 86°, or other similar values. In some embodiments, an imaginary vertical line 206 that is perpendicular to the first side 102a and/or the second side 102b of the substrate 102 extends through the TSV 110 and through the dielectric liner 112.

The TSV 110 continuously extends between the first sidewall $112s_1$ and the second sidewall $112s_2$ of the dielectric liner 112. Due to the angled orientation of the first sidewall $112s_1$ and the second sidewall $112s_2$, the TSV 110 has a tapered shape that increases in width as a distance from the second side 102b of the substrate 102 increases. For example, in some embodiments, the TSV 110 may have a top surface that faces away from the protrusion 110p and that has a first width $w_1$. In some embodiments, the TSV 110 may have a second width $w_2$, which is larger than the first width $w_1$, measured along the horizontally extending surface 110h. In various embodiments, the second width $w_2$ may be between 120% and approximately 200% of the first width $w_1$, between approximately 140% and approximately 180% of the first width $w_1$, or other similar values. Having the second width $w_2$ greater than 120% of the first width $w_1$ provides for good protection of sidewalls of the dielectric liner 112 during fabrication of the integrated chip 200. In various embodiments, the first width $w_1$ may be in a range of between approximately 1,000 nm and approximately 2,000 nm, between approximately 800 nm and approximately 1,500 nm or other similar values.

In some embodiments, the TSV 110 comprises a first sidewall $110s_1$ between sidewalls of the substrate 102 and a second sidewall $110s_2$ between sidewalls of the ILD structure 106. In some embodiments, the second sidewall $110s_2$ defines a protrusion 110p extending outward from a horizontally extending surface 110h of the TSV 110 to one of the plurality of interconnects 108. In some embodiments, the first sidewall $110s_1$ may be angled so that a width of the TSV 110 defined by the first sidewall $110s_1$ increases as a distance from the horizontally extending surface 110h decreases, while the second sidewall $110s_2$ may be angled so that a width of the protrusion 110p decreases as a distance from the horizontally extending surface 110h increases. In some embodiments, the protrusion 110p may have a width $w_p$ that is greater than or equal to the first width $w_1$. In some such embodiments, the TSV 110 has a top surface and a bottom surface with widths that are smaller than a maximum width of the TSV 110 that is vertically between the top surface and the bottom surface.

Figure 3:
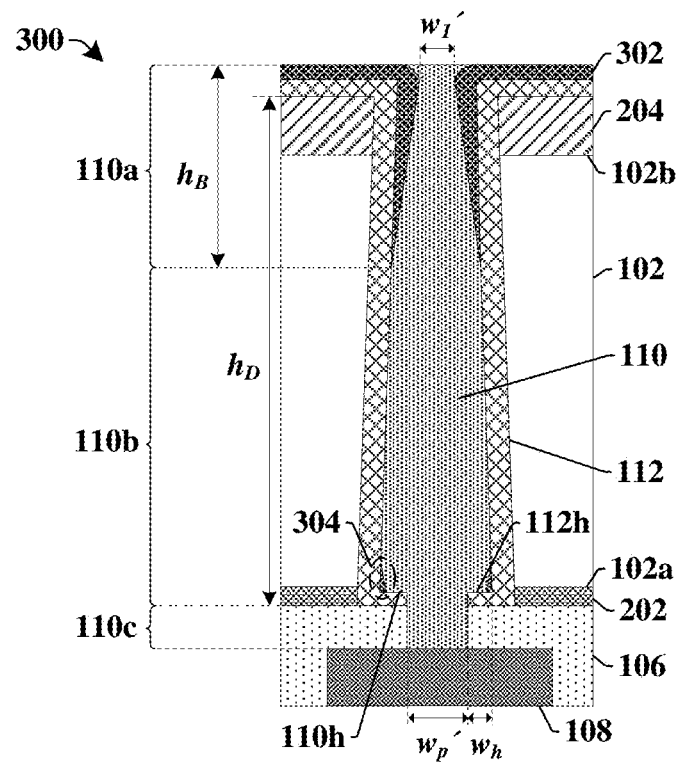
FIG. 3 illustrates a cross-sectional view of some additional embodiments of an integrated chip having a TSV with a reentrant profile.

FIG. 3 illustrates a cross-sectional view of some additional embodiments of an integrated chip 300 having a TSV with a reentrant profile.

The integrated chip 300 comprises a comprises a substrate 102 having one or more sidewalls extending between a first side 102a of the substrate 102 and a second side 102b of the substrate 102 opposing the first side 102a. A dielectric liner 112 lines the one or more sidewalls of the substrate 102. An etch blocking layer 302 is arranged on one or more sidewalls of the dielectric liner 112. A TSV 110 extends through the substrate 102 to a plurality of interconnects 108 disposed within an ILD structure 106 on the first side 102a of the substrate 102. In some embodiments, an etch blocking layer remnant 304 may be disposed along a lower surface of the TSV 110.

In some embodiments, the etch blocking layer 302 may continuously extend along a height $h_B$ that is less than a height $h_D$ of the dielectric liner 112. In some embodiments, the etch blocking layer 302 has a bottom that is separated from a horizontally extending ledge 112h of the dielectric liner 112 by a non-zero distance. In some embodiments, the etch blocking layer 302 may have a thickness that is in a range of between approximately 0.1 kÅ (kilo-Angstrom) and 1 kÅ, between approximately 0.5 kÅ (kilo-Angstrom) and 0.7 kÅ, or other similar values. In some embodiments, the etch blocking layer 302 has a thickness that varies over the height $h_B$ of the etch blocking layer 302. In some embodiments, the etch blocking layer 302 may continuously extend from a sidewall of the dielectric liner 112 to along the second side 102b of the substrate 102. In some embodiments, the etch blocking layer 302 may comprise a curved corner facing the TSV 110. In various embodiments, the etch blocking layer 302 may comprise a nitride (e.g., silicon nitride), an oxide (e.g., silicon oxide), a carbide (e.g., silicon carbide), or the like.

The etch blocking layer 302 is configured to decrease a width of the TSV 110 along the second side 102b of the substrate 102. By decreasing a width of the TSV 110, the etch blocking layer 302 is able to further restrict an etchant used to form a TSV hole during fabrication of the integrated chip 300. By further restricting an etchant used to form the TSV hole, a distance between a protrusion 110p and sidewalls of the TSV 110 can be increased. For example, in some embodiments a top surface of the TSV 110 may have a first width $w_1'$ that is in a range of between approximately 400 nm and approximately 600 nm, a horizontally extending surface of the TSV 110 may have a width $w_h$ that is in a range of between approximately 450 nm and approximately 650 nm, and the protrusion 110p may have a width $w_p'$ that is in a range of between approximately 50 nm and approximately 100 nm.

In some embodiments, the TSV 110 may comprise a first segment 110a directly between sidewalls of the etch blocking layer 302, a second segment 110b directly between sidewalls of the dielectric liner 112, and a third segment 110c directly between sidewalls of the ILD structure 106. The first segment 110a may have a sidewall oriented at a first slope, the second segment 110b may have a sidewall oriented at a second slope that is greater than the first slope, and the third segment 110c may have a third sidewall angled at a third slope that is greater than the second slope. In some embodiments, the first slope may be greater than the second slope. In some additional embodiments, the second slope may be greater than the first slope and/or the second slope.

Figure 4:
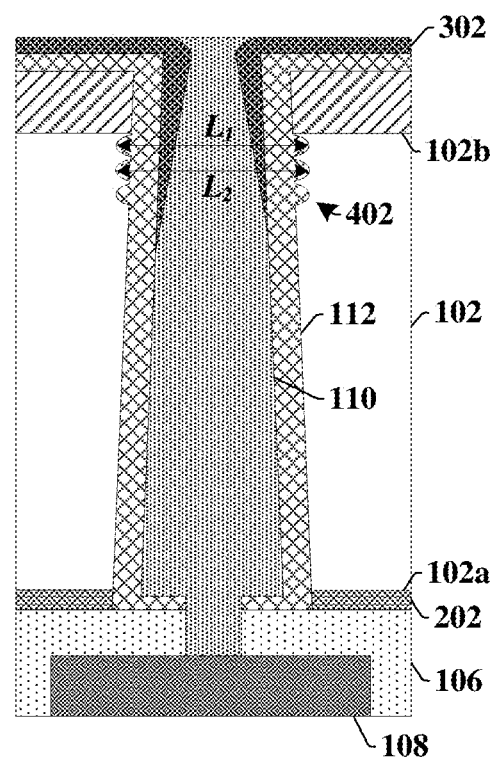
FIG. 4 illustrates a cross-sectional view of some additional embodiments of an integrated chip having a TSV with a reentrant profile.

FIG. 4 illustrates a cross-sectional view of some additional embodiments of an integrated chip 400 having a TSV with a reentrant profile.

The integrated chip 400 comprises a substrate 102 having one or more sidewalls extending between a first side 102a of the substrate 102 and a second side 102b of the substrate 102 opposing the first side 102a. The one or more sidewalls are respectively defined by one or more curved depressions 402 (e.g., scallops, arcs) that are vertically separated from one another. A dielectric liner 112 lines the one or more sidewalls of the substrate 102 and fills the one or more curved depressions 402. The dielectric liner 112 separates the substrate 102 from a TSV 110 extending through the substrate 102.

In some embodiments, the one or more curved depressions 402 along a first sidewall of the substrate 102 and the one or more curved depressions 402 along a second sidewall of the substrate 102 are separated by a lateral distance measured along a direction that is parallel to the first side 102a or the second side 102b of the substrate 102. In some embodiments, a first lateral distance $L_1$ between a first pair of curved depressions and a second lateral distance $L_2$ between a second pair of curved depressions may be substantially equal. In other embodiments, the first lateral distance $L_1$ between the first pair of curved depressions may be smaller than the second lateral distance $L_2$ between the second pair of curved depressions. In some embodiments, a depth of the one or more curved depressions 402 may change (e.g., decrease) as a distance from the second side 102b of the substrate 102 increases.

Figure 5:
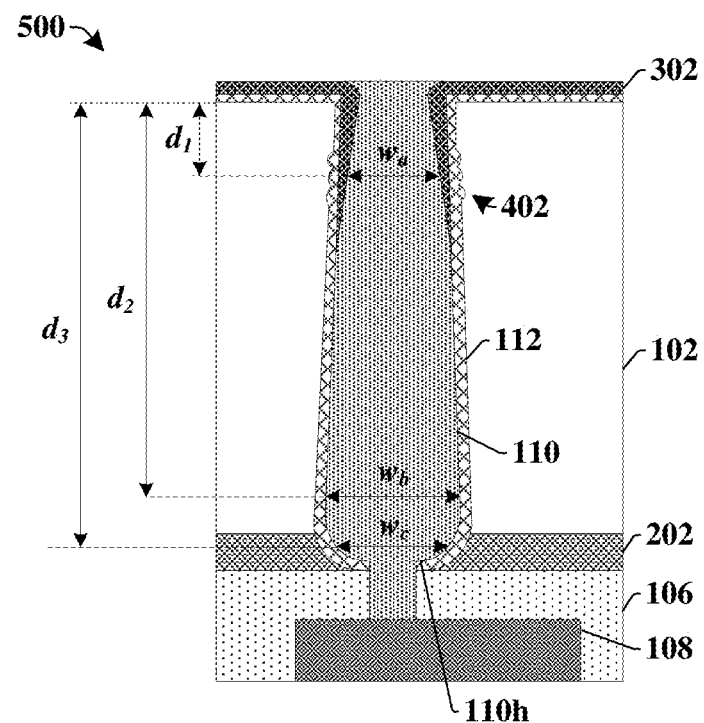
FIG. 5 illustrates a cross-sectional view of some additional embodiments of an integrated chip having a TSV with a reentrant profile.
Figure 6:
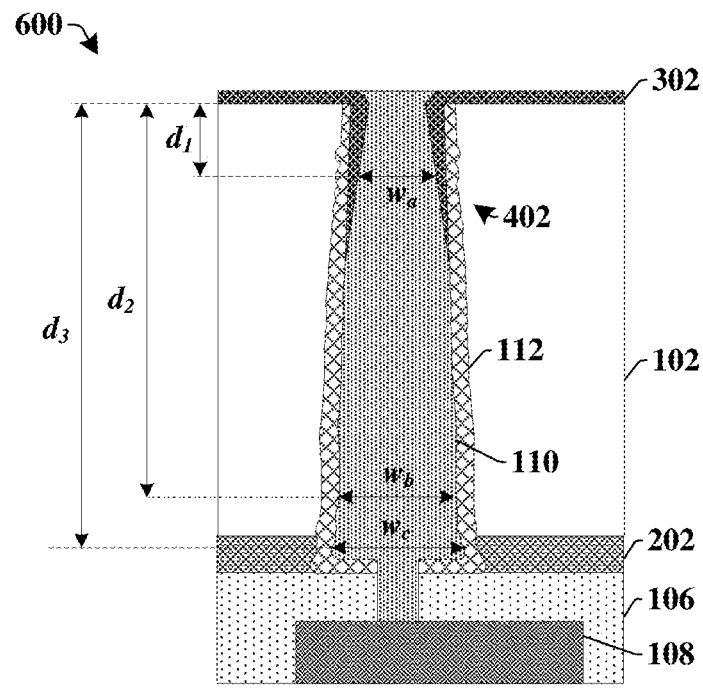
FIG. 6 illustrates a cross-sectional view of some additional embodiments of an integrated chip having a TSV with a reentrant profile.

In various embodiments, the reentrant profile of the disclosed TSV (e.g., TSV 110 of FIG. 1) may have different cross-sectional profiles. FIGS. 5-6 illustrate some non-limiting embodiments of exemplary profiles of a TSV having a reentrant profile.

FIG. 5 illustrates a cross-sectional view of some additional embodiments of an integrated chip 500 having a TSV 110 arranged between sidewalls of a substrate 102, a contact etch stop layer 202, and an ILD structure 106. The TSV 110 has sidewalls that are coupled to a horizontally extending surface 110h by way of a curved corner that curves inward, so as to decrease a width of the TSV 110 along the curve. In some embodiments, the curved corner of the TSV 110 may be between sidewalls of the substrate 102 and sidewalls of the contact etch stop layer 202.

The TSV 110 has a first width $w_a$ at a first depth $d_1$ below the second side 102b of the substrate 102, a second width $w_b$ at a second depth $d_2$ below the second side 102b, and a third width $w_c$ at a third depth $d_3$ below the second side 102b. In some embodiments, the second width $w_b$ is larger than the first width $w_a$ and the third width $w_c$. In some embodiments, the first width $w_a$ and the second width $w_b$ may be directly between sidewalls of the substrate 102, while the third width $w_c$ may be directly between sidewalls of the contact etch stop layer 202.

FIG. 6 illustrates a cross-sectional view of some additional embodiments of an integrated chip 600 having a TSV 110 arranged between sidewalls of a substrate 102, a contact etch stop layer 202, and an ILD structure 106. The TSV 110 has a first width $w_a$ at a first depth $d_1$ below the second side 102b of the substrate 102, a second width $w_b$ at a second depth $d_2$ below the second side 102b, and a third width $w_c$ at a third depth $d_3$ below the second side 102b. In some embodiments, the third width $w_c$ is larger than the first width $w_a$ and the second width $w_b$. In some embodiments, the first width $w_a$ and the second width $w_b$ may be directly between sidewalls of the substrate 102, while the third width $w_c$ may be directly between sidewalls of the contact etch stop layer 202.

Figure 7A:
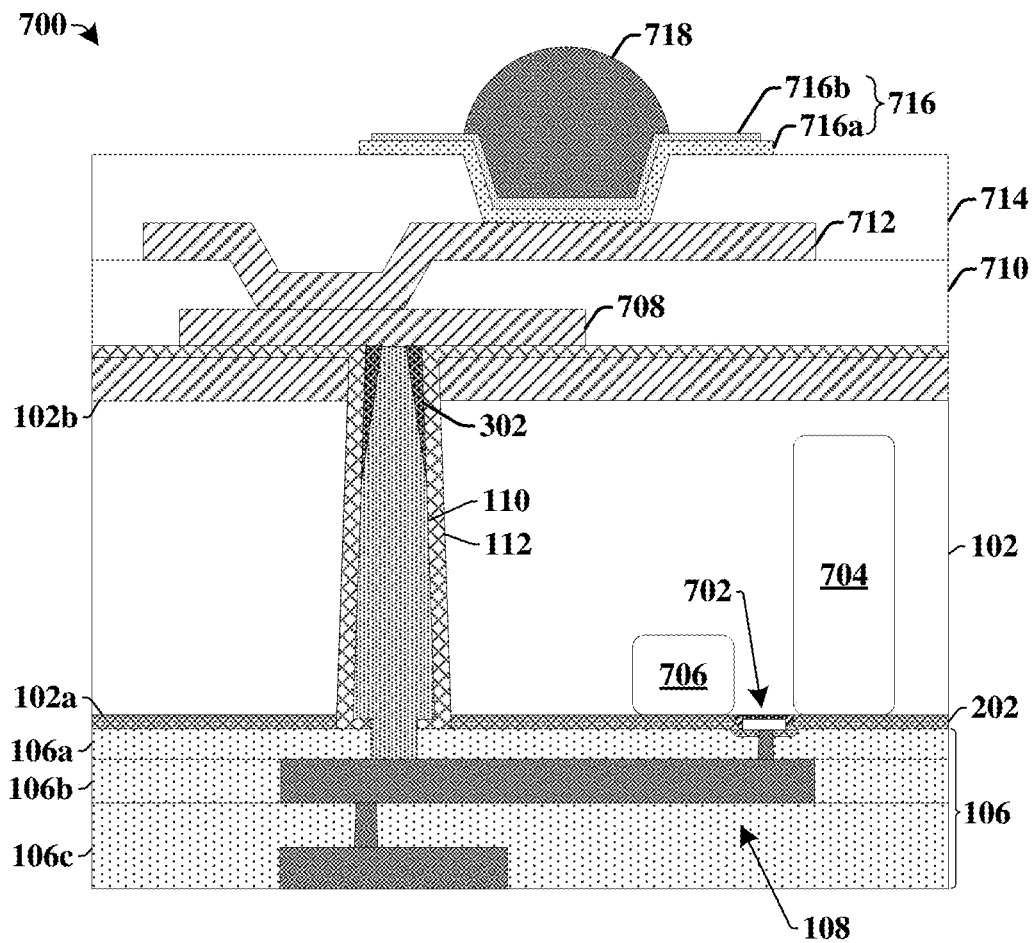
FIGS. 7A-7B illustrate some additional embodiments of an integrated chip having a TSV with a reentrant profile.

FIG. 7A illustrates a cross-sectional view of some additional embodiments of an integrated chip 700 having a TSV with a reentrant profile.

The integrated chip 700 comprises a transistor gate structure 702 arranged along a first side 102a (e.g., a front-side) of a substrate 102. The transistor gate structure 702 has a gate dielectric layer disposed along the first side 102a of the substrate 102 and a gate electrode arranged on the gate dielectric layer. In some embodiments, sidewall spacers are arranged on opposing sides of the gate electrode.

Figure 7B:
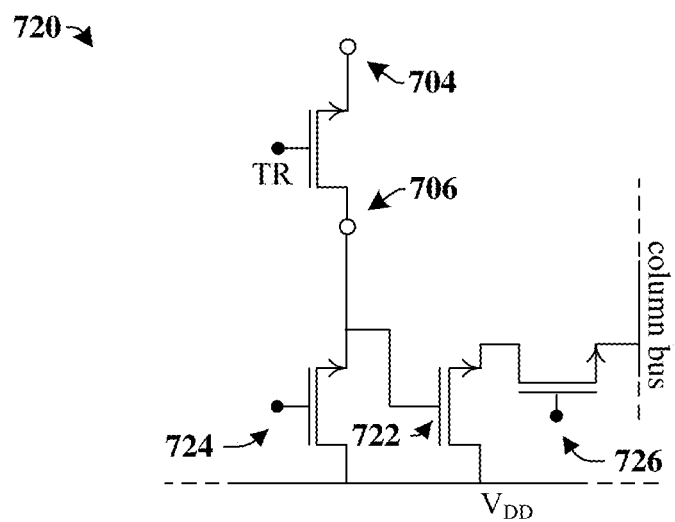

In some embodiments, the transistor gate structure 702 corresponds to a transfer transistor. In such embodiments, the transistor gate structure 702 is laterally arranged between a photodiode 704 and a floating diffusion well 706. The photodiode 704 may comprise a first region within the substrate 102 having a first doping type (e.g., n-type doping) and an adjoining second region within the substrate 102 having a second doping type (e.g., p-type doping) that is different than the first doping type. The transistor gate structure 702 is configured to control a transfer of charge from the photodiode 704 to the floating diffusion well 706. For example, as shown in an exemplary schematic diagram 720 of FIG. 7B, if a charge level is sufficiently high within the floating diffusion well 706, a source-follower transistor 722 is activated and charges are selectively output according to operation of a row select transistor 724 used for addressing. A reset transistor 726 is configured to reset the photodiode 704 between exposure periods.

Referring again to FIG. 7A, an ILD structure 106 is arranged along the first side 102a of the substrate 102. The ILD structure 106 comprises a plurality of stacked inter-level dielectric (ILD) layers 106a-106c. In various embodiments, the plurality of stacked ILD layers 106a-106c may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. The ILD structure 106 surrounds a plurality of interconnects 108 electrically coupled to the transistor gate structure 702.

In some embodiments, a first passivation layer 710 is disposed along a second side 102b (e.g., a back-side) of the substrate 102 opposing the first side 102a. In some embodiments, one or more redistribution layers (RDLs) 712 are disposed on the first passivation layer 710. The one or more RDLs 712 may comprise a vertical component (e.g., a redistribution via) that extends through an opening in the first passivation layer 710 and a lateral component (e.g., a redistribution wire) that extends over the first passivation layer 710. The lateral component re-distributes electrical signals to different areas along the second side 102b of the substrate 102, thereby enabling compatibility with different packaging options. In some embodiments, the one or more RDLs 712 may be arranged over a bond pad 708 disposed below the first passivation layer 710.

A second passivation layer 714 is arranged over the one or more RDL 712. In some embodiments, an under bump metallurgy (UBM) structure 716 extends through the second passivation layer 714 to contact the one or more RDLs 712. The UBM structure 716 serves as a solderable interface between the one or more RDLs 712 and a conductive bump 718 (e.g., a solder bump). In some embodiments, the UBM structure 716 comprises a stack of different metal layers, 716a and 716b, which serve as a diffusion layer, a barrier layer, a wetting layer, and/or an anti-oxidation layer. In various embodiments, the conductive bump 718 may comprise a solder bump, a copper bump, a metal bump including nickel (Ni) or gold (Au), or combinations thereof.

FIGS. 8-16 illustrate cross-sectional views 800-1600 of some embodiments of a method of forming an integrated chip having a TSV with a reentrant profile. Although FIGS. 8-16 are described in relation to a method, it will be appreciated that the structures disclosed in FIGS. 8-16 are not limited to such a method, but instead may stand alone as structures independent of the method.

Figure 8:
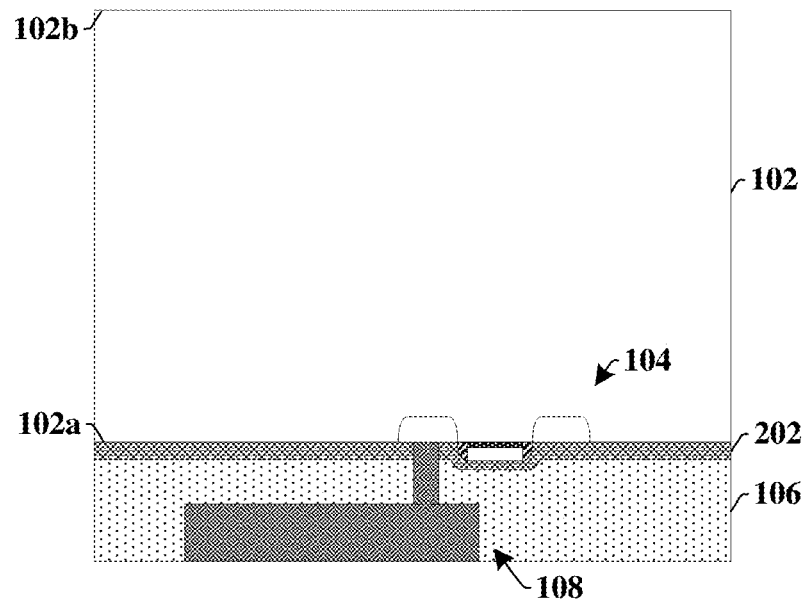
FIGS. 8-16 illustrate cross-sectional views of some embodiments of a method of forming an integrated chip having a TSV with a reentrant profile.

As shown in cross-sectional view 800 of FIG. 8, a substrate 102 is provided. The substrate 102 comprises a first side 102a and a second side 102b opposing the first side 102a. In some embodiments, one or more semiconductor devices 104 are formed on or within the first side 102a of the substrate 102. In various embodiments, the one or more semiconductor devices 104 may comprise a transistor device, an image sensor device, and/or the like.

In some embodiments, a contact etch stop layer 202 is formed on the first side 102a of the substrate 102. The contact etch stop layer 202 may comprise a nitride (e.g., silicon nitride), a carbide (e.g., silicon carbide), or the like. A plurality of interconnects 108 may be formed within an inter-level dielectric (ILD) structure 106 formed on the contact etch stop layer 202. In some embodiments, the plurality of interconnects 108 may respectively be formed using a damascene process (e.g., a single damascene process or a dual damascene process). The damascene process is performed by forming an ILD layer on the first side 102a of the substrate 102, etching the ILD layer to form a via hole and/or a trench, and filling the via hole and/or the trench with a conductive material. In some embodiments, the ILD layer may be deposited by a deposition process (e.g., a physical vapor deposition (PVD) process, a chemical vapor deposition (CVD) process, a plasma enhanced chemical vapor deposition (PE-CVD) process, an atomic layer deposition (ALD) process, etc.) and the conductive material (e.g., tungsten, copper, aluminum, or the like) may be formed using a deposition process and/or a plating process (e.g., electroplating, electro-less plating, etc.).

Figure 9:
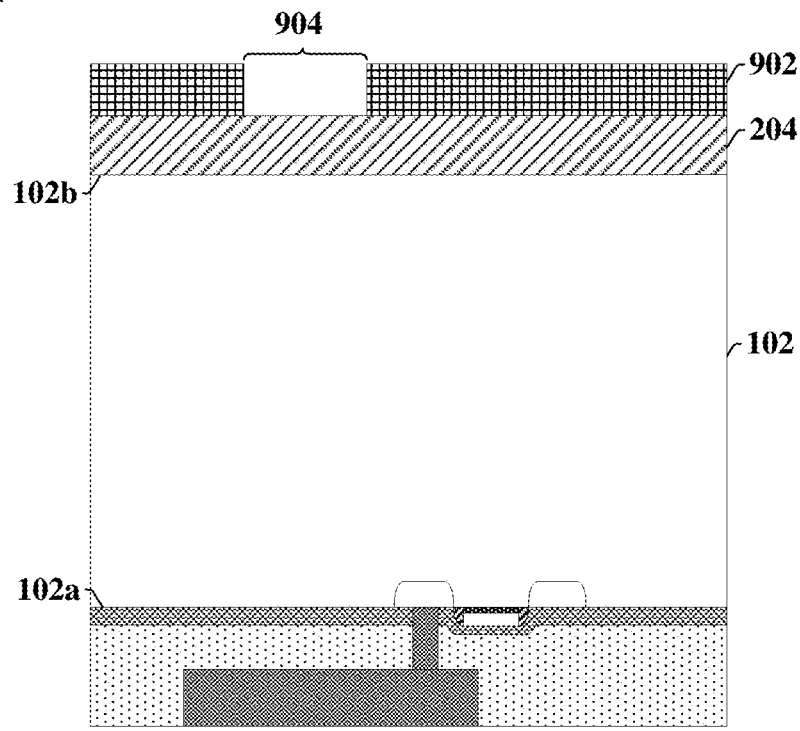

As shown in cross-sectional view 900 of FIG. 9, a dielectric layer 204 is formed on a second side 102b of the substrate 102 opposing the first side 102a of the substrate 102. In some embodiments, the dielectric layer 204 may comprise an oxide (e.g., silicon oxide), a nitride (e.g., silicon nitride), or the like. In some embodiments, the dielectric layer 204 may be formed by way of a deposition process (e.g., a PVD process, a CVD process, a PE-CVD process, an ALD process, etc.). A masking layer 902 is formed over the dielectric layer 204. The masking layer 902 comprises one or more sidewalls defining an opening 904 exposing a part of the dielectric layer 204. In some embodiments, the masking layer 902 may comprise a photosensitive material (e.g., a photoresist). In such embodiments, the masking layer 902 may be formed by way of a spin-on process.

Figure 10:
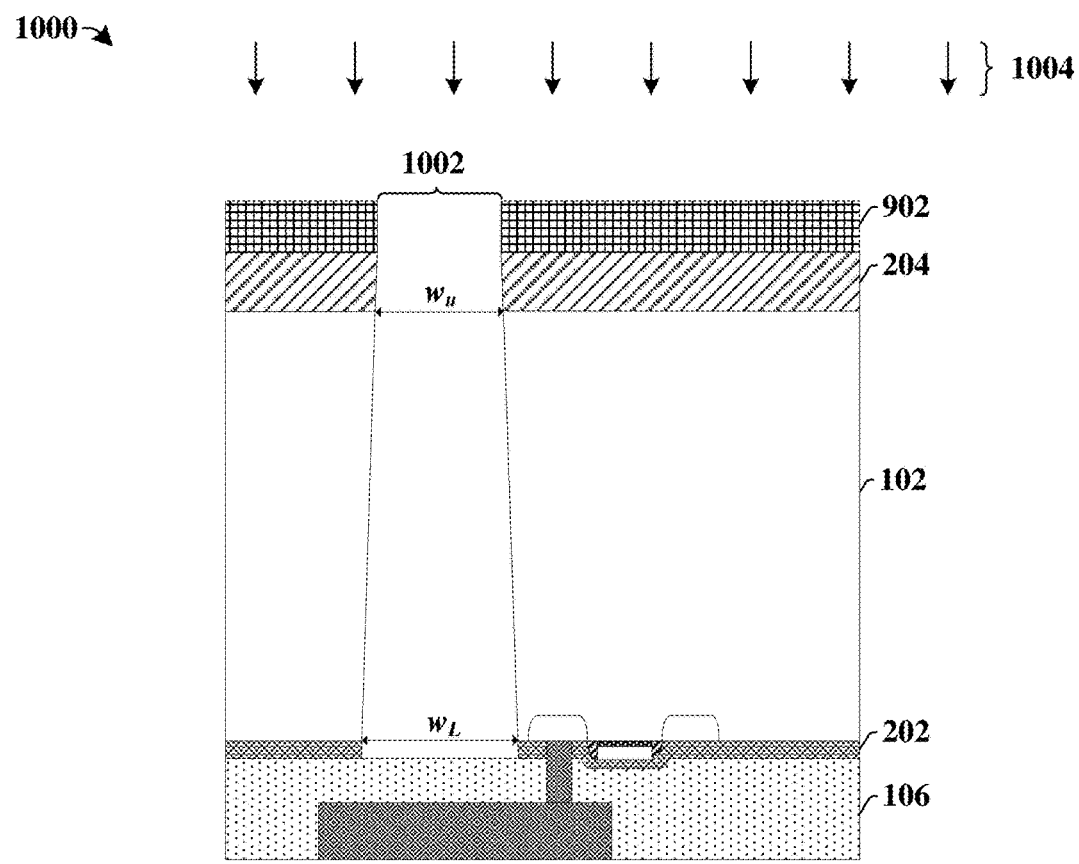

As shown in cross-sectional view 1000 of FIG. 10, a first etching process is performed to pattern the dielectric layer 204 and the substrate 102 according to the masking layer 902. The first etching process forms sidewalls of the substrate 102 that extend through the substrate 102 and that define a first TSV opening 1002 (i.e., an intermediate TSV hole). In some embodiments, the first TSV opening 1002 also extends through the contact etch stop layer 202 to expose the ILD structure 106. The sidewalls of the substrate 102 are angled to give the first TSV opening 1002 a reentrant profile that increases in width as a distance from the second side 102b of the substrate 102 increases. For example, the first TSV opening 1002 has an upper width $w_u$ along the second side 102b of the substrate 102 and a lower width $w_L$, which is larger than the upper width $w_u$, along the first side 102a of the substrate 102. In some embodiments, the first etching process is performed by exposing the substrate 102 to a first etchant 1004 according to the masking layer 902. In some embodiments, the first etchant 1004 may comprise a plasma etchant having a fluorine based etching chemistry (e.g., a $SF_6$ plasma, or the like). In some embodiments, a DC self-bias may be increased as a depth of the first etching process increases. For example, in some embodiments, the DC self-bias may increase from approximately 100V to approximately 150V as a depth of the first etching process increases. Increasing the DC self-bias increases an etching rate of the first etchant 1004 and a width of the first TSV opening 1002.

Figure 11:
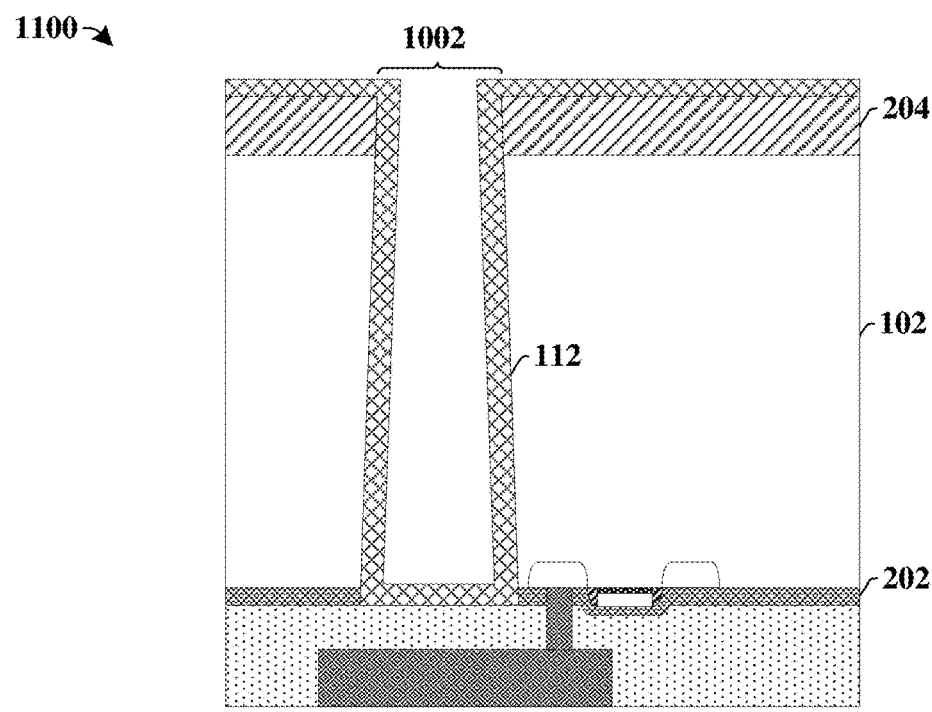

As shown in cross-sectional view 1100 of FIG. 11, a dielectric liner 112 is formed along surfaces of the substrate 102, the dielectric layer 204, and/or the ILD structure 106, which define the first TSV opening 1002. The dielectric liner 112 continuously extends from a first sidewall of the substrate 102 to an opposing second sidewall of the substrate 102 as viewed along cross-sectional view 1100. In some embodiments, the dielectric liner 112 may comprise an oxide (e.g., silicon oxide), a carbide (e.g., silicon carbide), or the like. In some embodiments, the dielectric liner 112 may be formed by way of a deposition process (e.g., a PVD process, a CVD process, a PE-CVD process, an ALD process, etc.).

Figure 12:
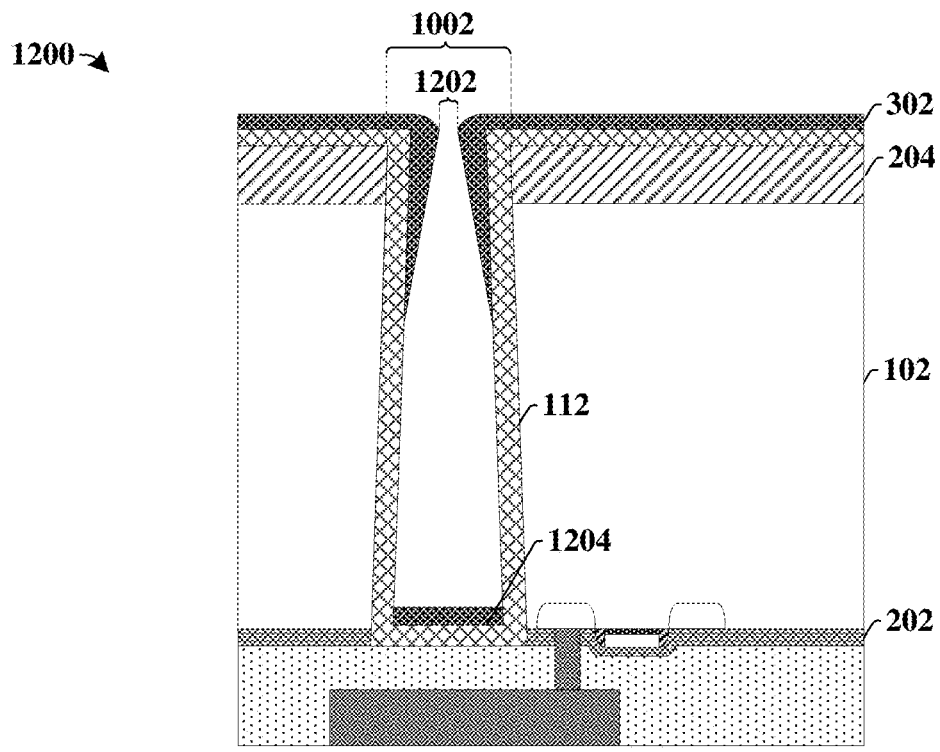

As shown in cross-sectional view 1200 of FIG. 12, an etch blocking layer 302 is formed on the dielectric liner 112. The etch blocking layer 302 may be formed along sidewalls of the dielectric liner 112 and on an upper surface of the dielectric liner 112 facing away from the substrate 102. The etch blocking layer 302 has sidewalls that define an opening 1202 over the first TSV opening 1002. In some embodiments, the etch blocking layer 302 may further be formed on a horizontally extending surface 1204 of the dielectric liner 112 that is within the first TSV opening 1002. In some embodiments, the etch blocking layer 302 covers a part, but not all, of the sidewalls of the dielectric liner 112. In such embodiments, the etch blocking layer 302 continuously extends along a smaller height than the dielectric liner 112. In some embodiments, the etch blocking layer 302 may comprise an oxide (e.g., silicon oxide), a nitride (e.g., silicon nitride), a carbide (e.g., silicon carbide), or the like. In various embodiments, the etch blocking layer 302 may be formed by way of a deposition process (e.g., a PVD process, a CVD process, a PE-CVD process, an ALD process, etc.). In some embodiments, the etch blocking layer 302 may be formed to a thickness that is in a range of between approximately 1 kÅ and approximately 2 kÅ.

Figure 13:
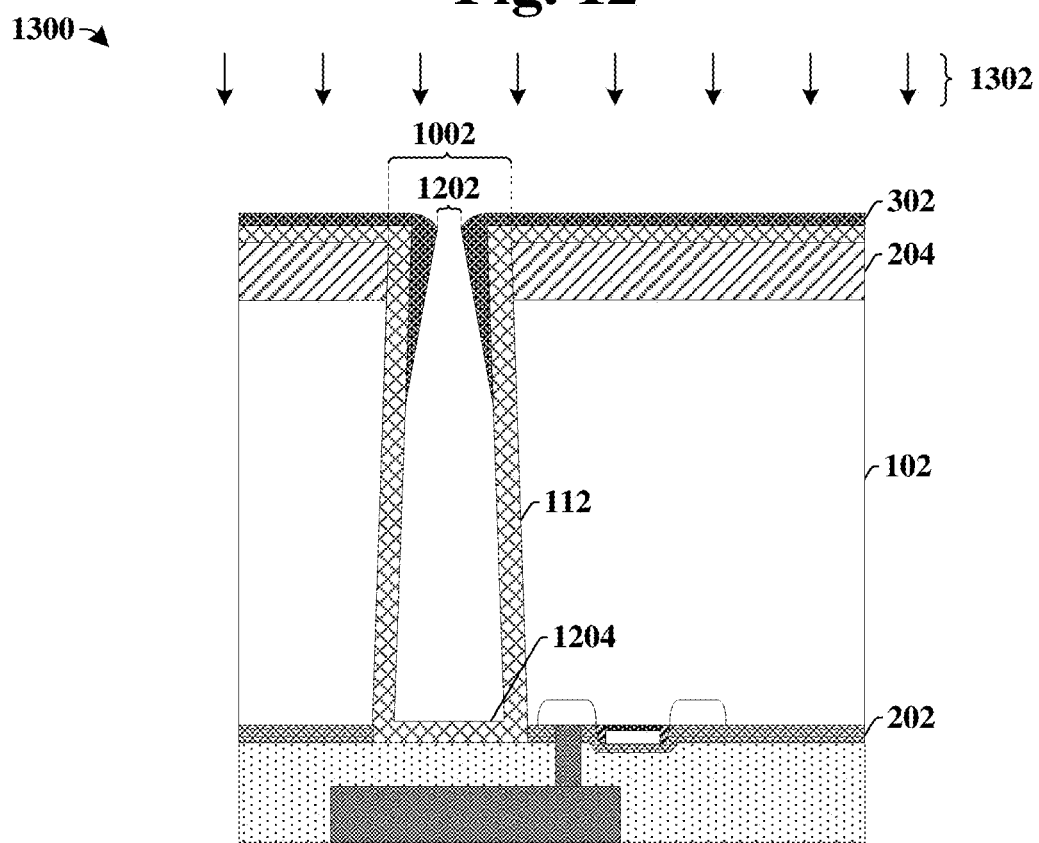

As shown in cross-sectional view 1300 of FIG. 13, the etch blocking layer 302 is selectively removed from the horizontally extending surface 1204 of the dielectric liner 112 within the first TSV opening 1002. In some embodiments, the etch blocking layer 302 may be removed by exposing the etch blocking layer 302 to a removal etchant 1302. In some embodiments, the removal etchant 1302 may comprise a dry etchant (e.g., having a chlorine based etching chemistry and/or a fluorine based etching chemistry). In some embodiments, a masking layer (not shown) may be formed onto the dielectric liner 112 in areas outside of the first TSV opening 1002 prior to exposing the etch blocking layer 302 to the removal etchant 1302. In some embodiments, the masking layer may comprise a photosensitive material (e.g., a photoresist).

In some embodiments, the removal etchant 1302 may reduce a thickness of the etch blocking layer 302 along sidewalls of the dielectric liner 112. For example, in some embodiments, the removal etchant 1302 may reduce a thickness of the etch blocking layer 302 by between approximately 50% and approximately 75%. In some embodiments, the etch blocking layer 302 may have a thickness of between approximately 0.5 kÅ and approximately 0.7 kÅ after being removed from the horizontally extending surface of the dielectric liner 112. In some embodiments (not shown), the removal etchant 1302 may leave remnants of the etch blocking layer 302 along outer edges of the horizontally extending surface 1204 of the dielectric liner 112.

Figure 14:
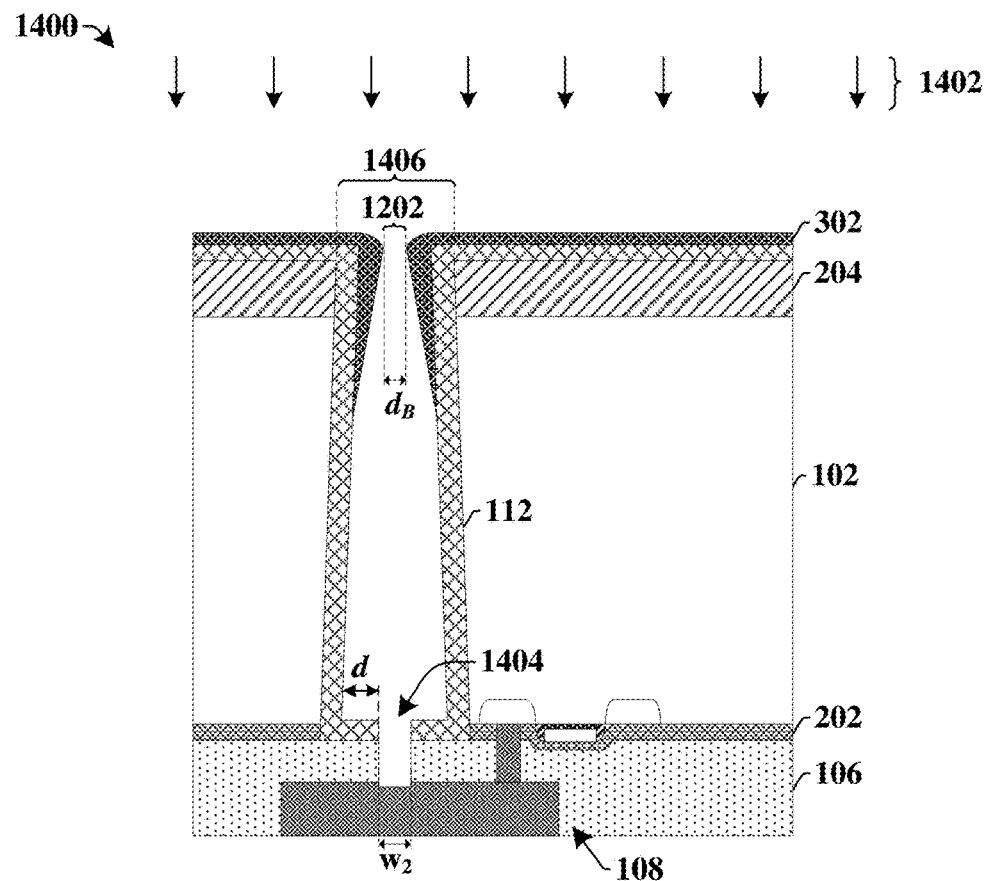

As shown in cross-sectional view 1400 of FIG. 14, a second etching process is performed to selectively etch the dielectric liner 112 and the ILD structure 106 according to the etch blocking layer 302. The second etching process defines a TSV hole 1406 (comprising the first TSV opening (1002 of FIG. 13) and a second TSV opening 1404) that exposes one of the plurality of interconnects 108. In some embodiments, the second etching process exposes the dielectric liner 112 and the ILD structure 106 to a second etchant 1402 according to the opening 1202 defined by the etch blocking layer 302. In some embodiments, the second etchant 1402 is a different etchant than the first etchant (1004 of FIG. 10). In some embodiments, the second etchant 1402 is an anisotropic etchant (e.g., a dry etchant). Because of the reentrant profile of the first TSV opening (1002 of FIG. 13), the dielectric liner 112 and/or the substrate 102 overlies a part of the dielectric liner 112 and thereby mitigates an amount of the second etchant 1402 that reaches sidewalls of the dielectric liner 112. By mitigating an amount of the second etchant 1402 that reaches sidewalls of the dielectric liner 112, damage to the sidewalls of the dielectric liner 112 can be reduced. Furthermore, because an amount of the second etchant 1402 that reaches the sidewalls of the dielectric liner 112 is mitigated, the second etchant 1402 forms a second TSV opening 1404 that extends through the dielectric liner 112 at a position that is separated from the sidewalls of the dielectric liner 112 by a non-zero distance d. The second TSV opening 1404 exposes a first interconnect of the plurality of interconnects 108. After the second etching process is completed, the dielectric liner 112 has a horizontally extending ledge 112h. In some embodiments, the second TSV opening 1404 may have a width $w_2$ that is greater than or equal to a distance $d_B$ between sidewalls of the etch blocking layer 302 defining the opening 1202.

Figure 15:
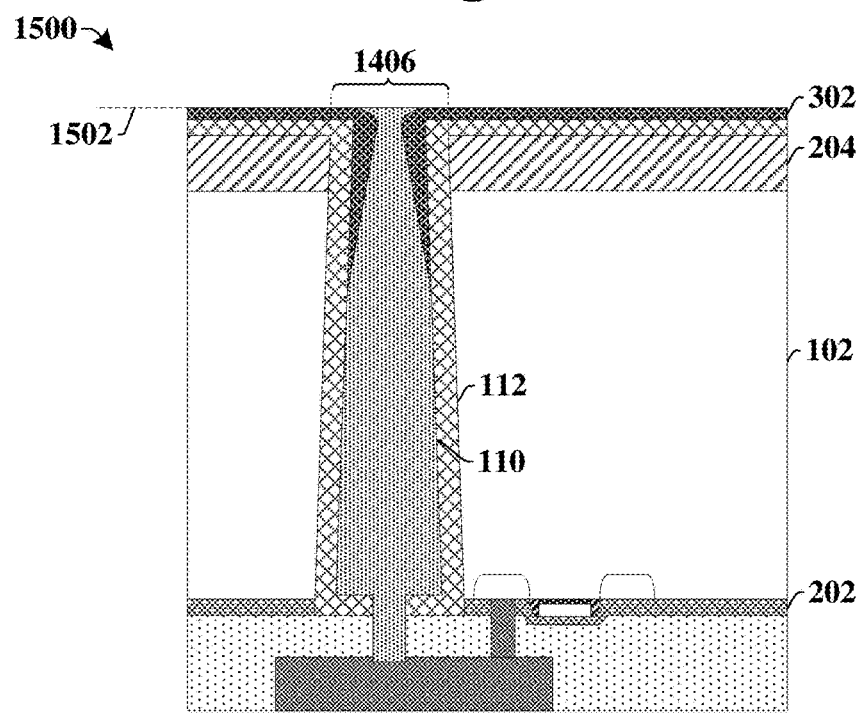

As shown in cross-sectional view 1500 of FIG. 15, a conductive material is formed within the TSV hole 1406. The conductive material may be formed by way of a deposition process and/or a plating process (e.g., electroplating, electro-less plating, etc.). In various embodiments, the conductive material may comprise copper, aluminum, or the like. After forming the conductive material within the TSV hole 1406, a planarization process may be performed (along line 1502) to remove excess of the conductive material from over the etch blocking layer 302 and to define a through-substrate-via (TSV) 110 extending through the substrate 102. In some embodiments (not shown), the planarization process may further remove the etch blocking layer 302 and/or the dielectric liner 112 from over the substrate 102. In other embodiments, the etch blocking layer 302 and/or the dielectric liner 112 may remain over the substrate 102 after the planarization process is completed. In some embodiments, the planarization process may comprise a chemical mechanical polishing (CMP) process. In other embodiments, the planarization process may comprise an etching process and/or a grinding process, for example.

Figure 16:
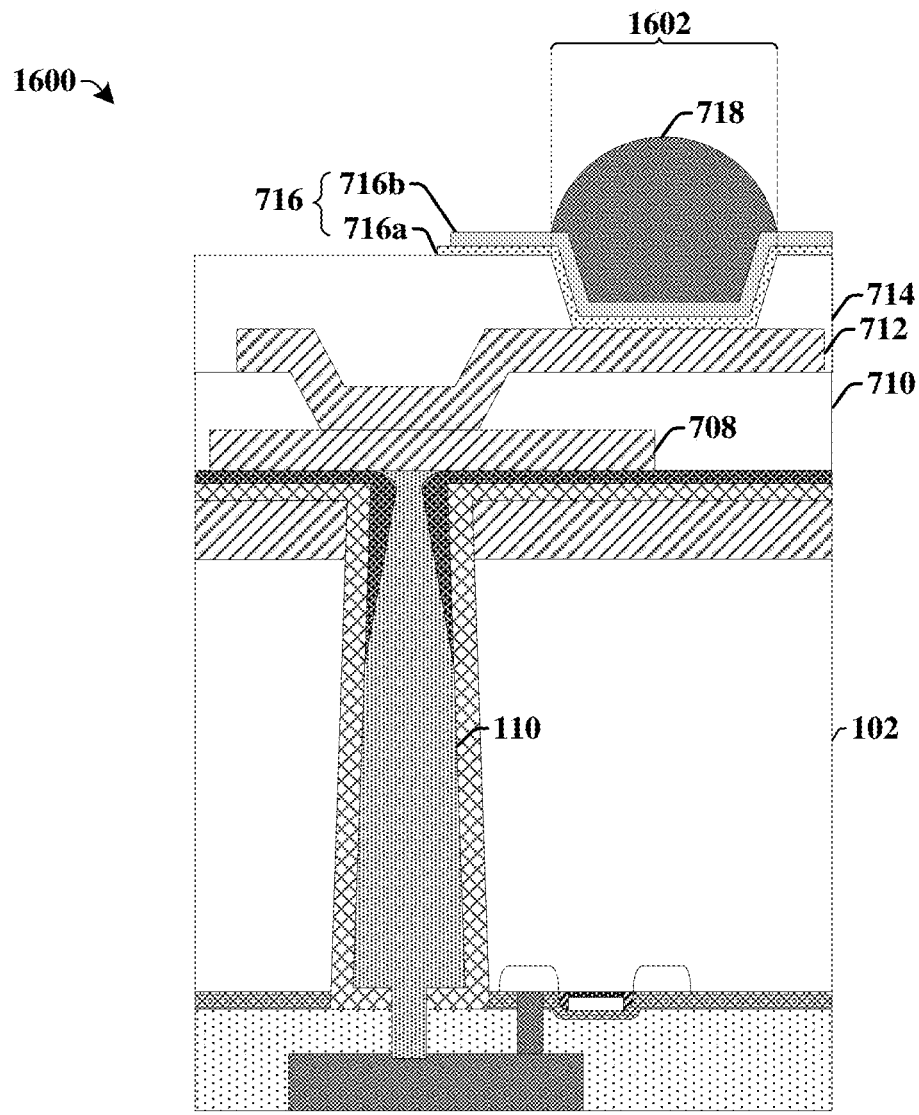

As shown in cross-sectional view 1600 of FIG. 16, a bond pad 708 is formed over the TSV 110. A first passivation layer 710 may be formed over the bond pad 708. One or more redistribution layers (RDLs) 712 are formed over the first passivation layer 710. In some embodiments, the one or more RDLs 712 may be formed by etching the first passivation layer 710 to expose the bond pad 708, and forming a second conductive material over the first passivation layer 710. A second passivation layer 714 is formed over the first passivation layer 710. The second passivation layer 714 is subsequently etched to form an under bump metallurgy (UBM) opening 1602 that exposes the one or more RDLs 712.

An under bump metallurgy (UBM) structure 716 is formed within the UBM opening 1602. The UBM structure 716 comprises a stack of different metal layers, 716a and 716b, which serve as a diffusion layer, a barrier layer, a wetting layer, and/or an anti-oxidation layer. The UBM structure 716 may be formed by successive deposition processes. A conductive bump 718 is formed on the UBM structure 716. In various embodiments, the conductive bump 718 may comprise a solder bump, a copper bump, a metal bump including nickel (Ni) or gold (Au), or combinations thereof.

FIGS. 17-24 illustrate cross-sectional views 1700-2400 of some additional embodiments of a method of forming an integrated chip having a TSV with a reentrant profile. Although FIGS. 17-24 are described in relation to a method, it will be appreciated that the structures disclosed in FIGS. 17-24 are not limited to such a method, but instead may stand alone as structures independent of the method.

Figure 17:
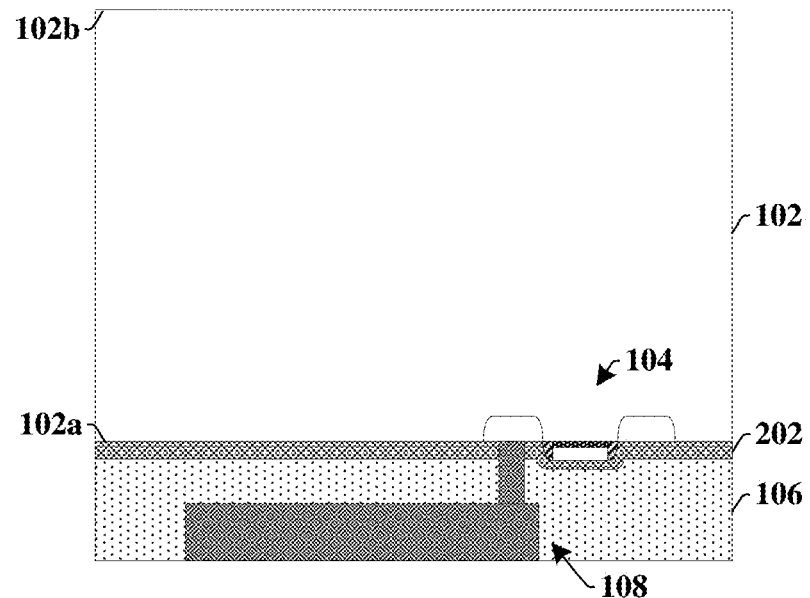
FIGS. 17-24 illustrate cross-sectional views of some additional embodiments of a method of forming an integrated chip having a TSV with a reentrant profile.

As shown in cross-sectional view 1700 of FIG. 17, one or more semiconductor devices 104 (e.g., a transistor device, an image sensor device, and/or the like) are formed on and/or within a first side 102a of a substrate 102. In some embodiments, a contact etch stop layer 202 is formed on the first side 102a of the substrate 102. A plurality of interconnects 108 may be formed within an ILD structure 106 formed on the contact etch stop layer 202.

Figure 18:
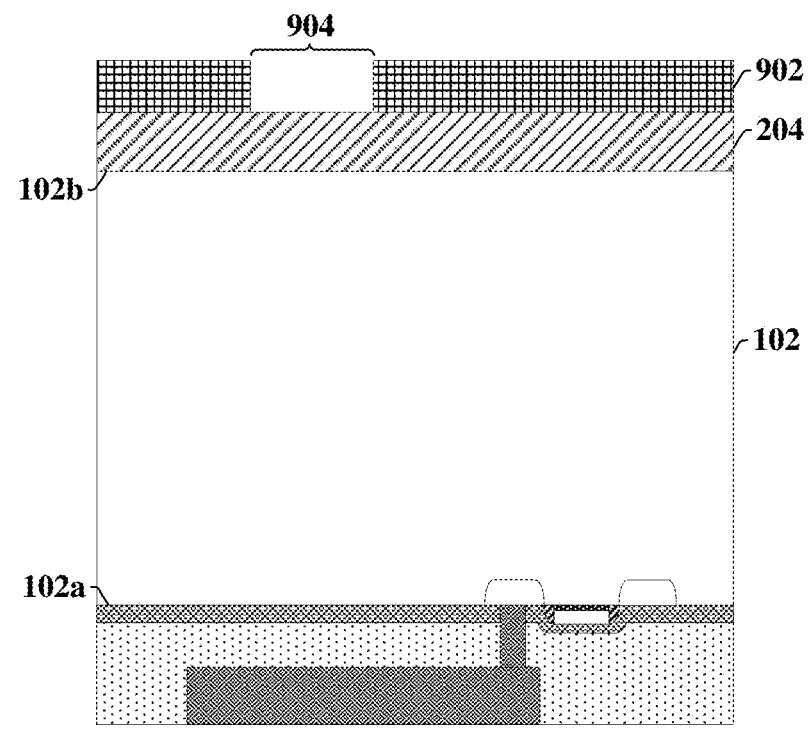

As shown in cross-sectional view 1800 of FIG. 18, a dielectric layer 204 is formed on a second side 102b of the substrate 102 opposing the first side 102a of the substrate 102. A masking layer 902 is formed over the dielectric layer 204. The masking layer 902 comprises one or more sidewalls defining an opening 904 exposing a part of the dielectric layer 204.

As shown in cross-sectional views 1900-1912 of FIGS. 19A-19E, a first etching process is performed to pattern the dielectric layer 204 and the substrate 102 according to the masking layer 902. The first etching process forms sidewalls defining a first TSV opening 1916 (i.e., an intermediate TSV hole) extending through the substrate 102. In some embodiments, the first TSV opening 1916 also extends through the contact etch stop layer 202 to expose the ILD structure 106 arranged along the first side 102a of the substrate 102. The sidewalls are angled to give the first TSV opening 1916 a reentrant profile that increases in width as a distance from the second side 102b of the substrate 102 increases.

In some embodiments, the first etching process may comprise a multi-step dry etch process (e.g., a Bosch etch process). The multi-step dry etch process comprises a plurality of cycles that respectively perform steps of exposing the substrate 102 to a first etchant 1902 to form a curved depression 402 within the substrate 102 and then subsequently forming a protective layer 1908 on the substrate 102. Each of the plurality of cycles forms a curved depression 402 within a sidewall of the substrate 102. In some embodiments, within a cycle a first gas may be introduced into a processing chamber to perform an etch during a first time period, the processing chamber may be purged, and then a second gas species may be in-situ (i.e., without breaking a vacuum) introduced into the process chamber to form the protective layer 1908 during a subsequent time period.

Figure 19A:
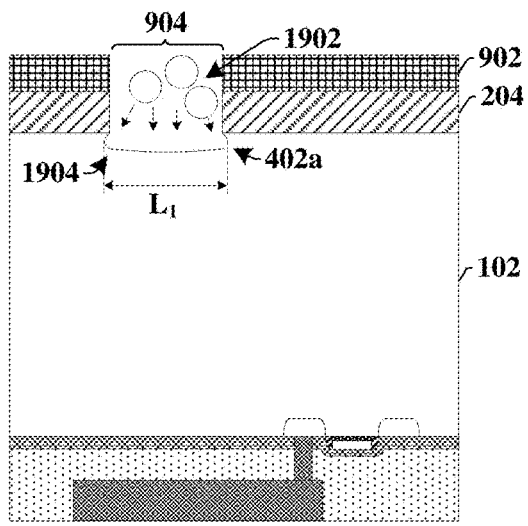
Figure 19B:
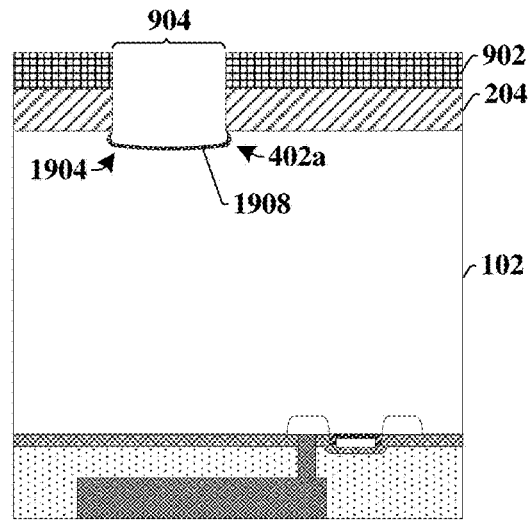
Figure 19C:
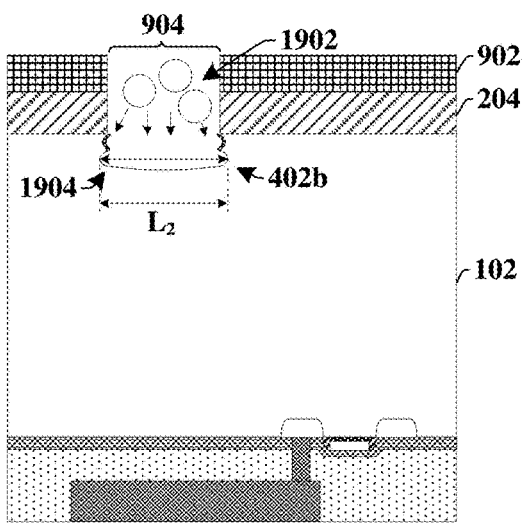
Figure 19D:
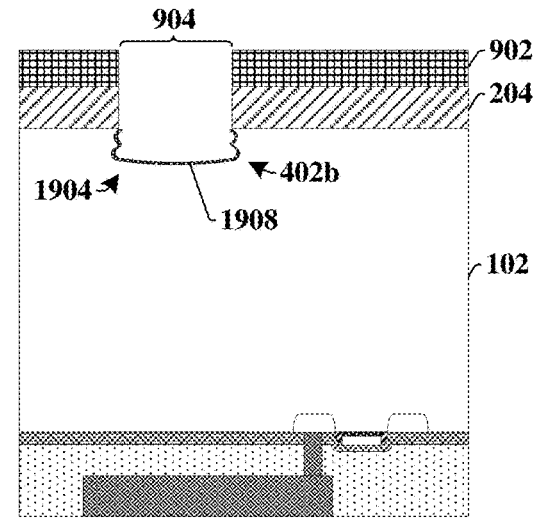
Figure 19E:
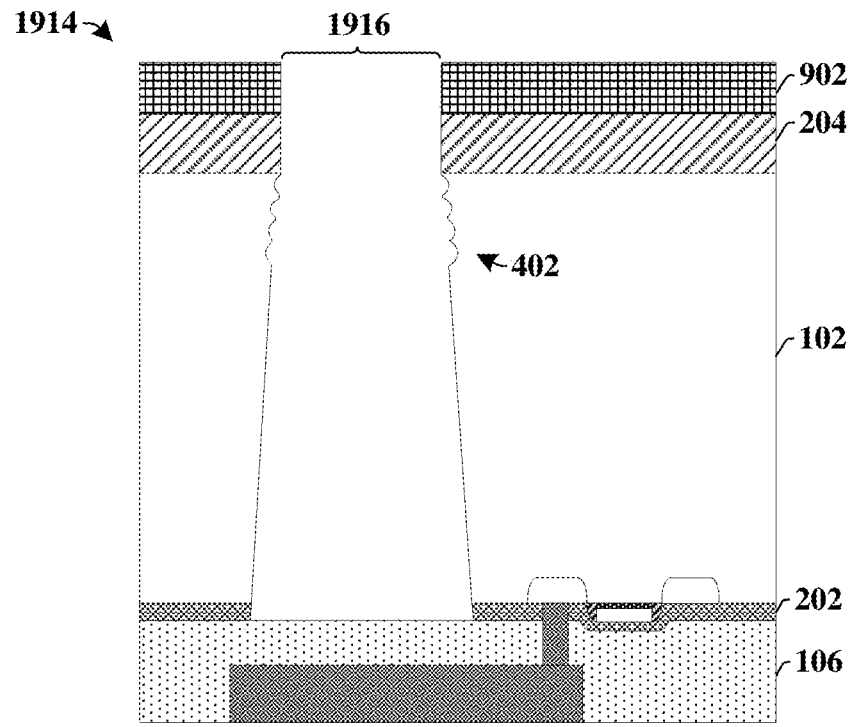

For example, during a first cycle, shown in cross-sectional view 1900 of FIG. 19A, a first etchant 1902 is brought into contact with the substrate 102 to form a cavity 1904 having a first pair of curved depressions 402a within opposing sidewalls of the substrate 102. In some embodiments, the first pair of curved depressions 402a are separated by a first lateral distance $L_1$. After forming the first pair of curved depressions 402a, a protective layer 1908 is formed onto interior surfaces of the substrate 102 defining the cavity 1904, as shown in cross-sectional view 1906 of FIG. 19B. During a second cycle, shown in cross-sectional view 1910 of FIG. 19C, the first etchant 1902 is re-introduced into the cavity 1904 to form a second pair of curved depressions 402b within opposing sidewalls of the substrate 102. In some embodiments, the second pair of curved depressions 402b are separated by a second lateral distance $L_2$. After forming the second pair of curved depressions 402b, the protective layer 1908 is formed onto interior surfaces of the substrate 102 defining the cavity 1904, as shown in cross-sectional view 1912 of FIG. 19D. Cross-sectional view 1914 of FIG. 19E illustrates the first TSV opening 1916 after the first etching process is complete. The first TSV opening 1916 extends through the substrate 102 and the contact etch stop layer 202 to expose the ILD structure 106.

In some embodiments, the first etchant 1902 may comprise a dry etchant having an etching chemistry comprising tetrafluoromethane ($CF_4$), sulfur hexafluoride ($SF_6$), and/or nitrogen trifluoride ($NF_3$), for example. In some embodiments, the protective layer 1908 may be formed by exposing the substrate 102 to a polymer gas (e.g., $C_4F_8$). In some embodiments, respective cycles of the first etching process may last for a time of between 0.05 seconds and 0.3 seconds. In some embodiments, a ratio between a time of an etch and a time of a deposition of the protective layer 1908 within a cycle may be between approximately 2 and approximately 3 to form the first TSV opening 1916 with the reentrant profile. For example, in some embodiments, an etch portion of a cycle may last for approximately 0.2 second and a deposition portion of the cycle may last for approximately 0.1 second. In some embodiments, a DC self-bias of the first etching process may be increased as a depth of the etch increases. For example, in some embodiments, the DC self-bias may increase from approximately 100V to approximately 150V as a depth of the first etching process increases.

In some embodiments, once the first etching process is completed, the protective layer 1908 is removed from within the first TSV opening 1916. In some embodiments, the protective layer 1908 may be removed by exposing the protective layer 1908 to a wet etchant. In some embodiments, the wet etchant may comprise a diluted hydrofluoric acid, potassium hydroxide, or the like.

Figure 20:
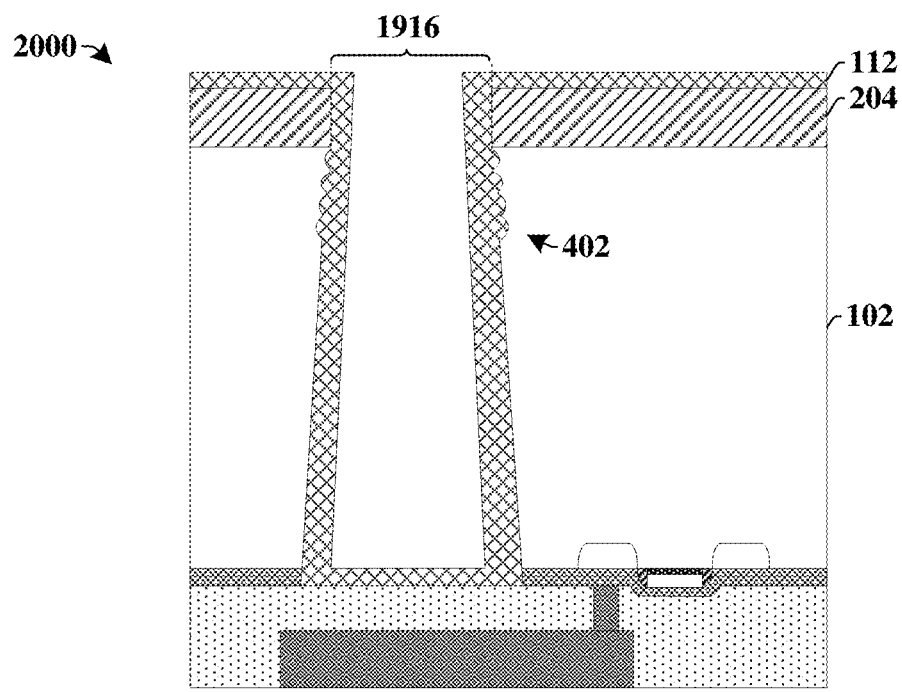

As shown in cross-sectional view 2000 of FIG. 20, a dielectric liner 112 is formed along surfaces defining the first TSV opening 1916. For example, the dielectric liner 112 may be formed along sidewalls of the substrate 102, the dielectric layer 204, and/or on the ILD structure 106.

Figure 21:
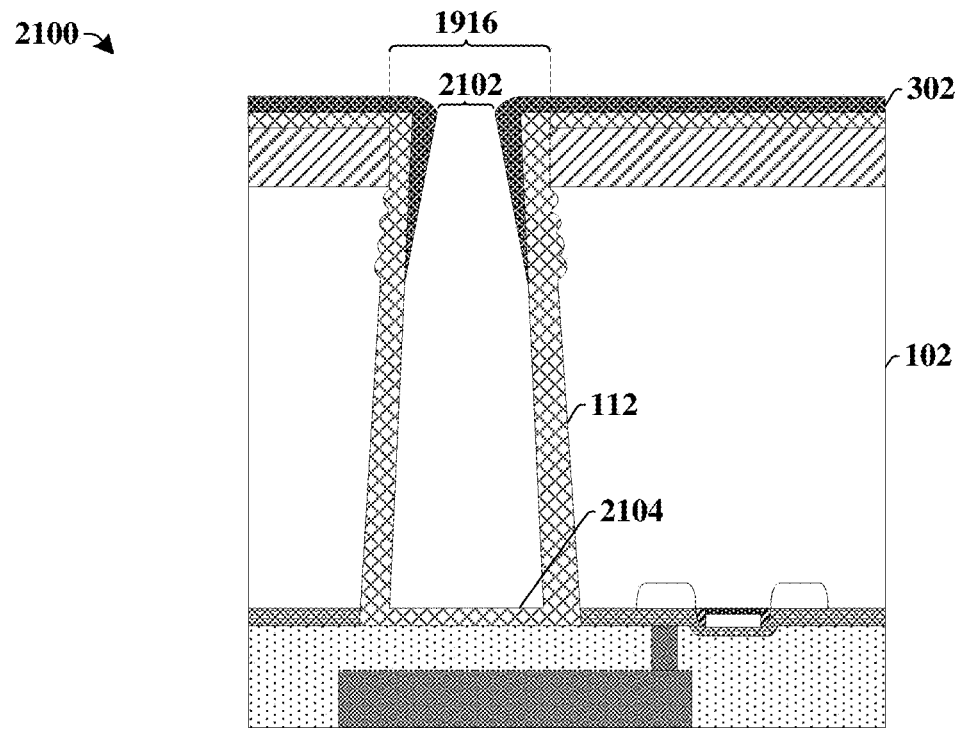

As shown in cross-sectional view 2100 of FIG. 21, an etch blocking layer 302 is formed on the dielectric liner 112. The etch blocking layer 302 may be formed along sidewalls of the dielectric liner 112 and on an upper surface of the dielectric liner 112 facing away from the substrate 102. The etch blocking layer 302 has sidewalls that define an opening 2102 over the first TSV opening 1916. In some embodiments (not shown), the etch blocking layer 302 may further be formed on a horizontally extending surface 2104 of the dielectric liner 112 that is within the first TSV opening 1916. In such embodiments, the etch blocking layer 302 is subsequently removed from the horizontally extending surface 2104 of the dielectric liner 112 within the first TSV opening 1916.

Figure 22:
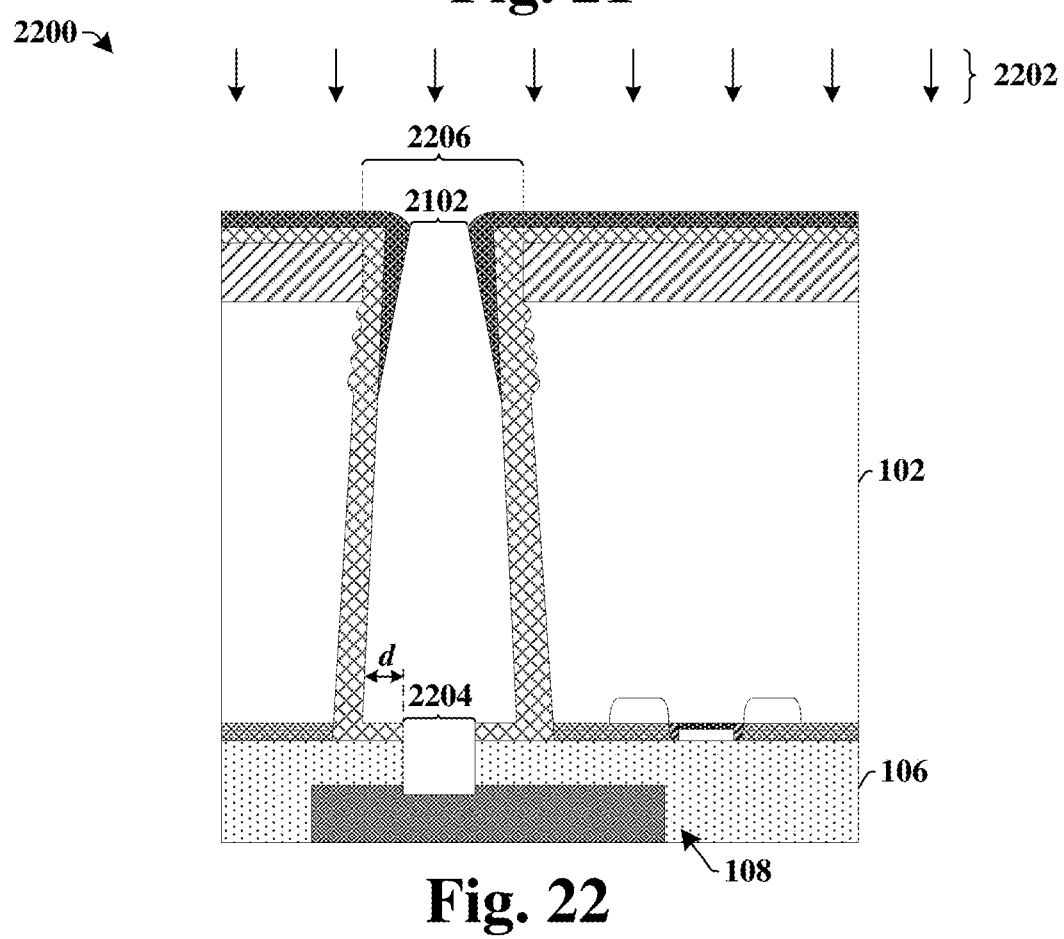

As shown in cross-sectional view 2200 of FIG. 22, a second etching process is performed to selectively etch the dielectric liner 112 and the ILD structure 106 according to the opening 2102 defined by the sidewalls of the etch blocking layer 302. The second etching process defines a TSV hole 2206 (comprising the first TSV opening (1916 of FIG. 21) and a second TSV opening 2204) that exposes one of the plurality of interconnects 108. In some embodiments, the second etching process exposes the dielectric liner 112 and the ILD structure 106 to a second etchant 2202 according to the opening 2102 defined by the etch blocking layer 302. Because of the reentrant profile of the first TSV opening (1916 of FIG. 21), the dielectric liner 112 and/or the substrate 102 overlies a part of the dielectric liner 112 and thereby mitigates an amount of the second etchant 2202 that reaches and damages sidewalls of the dielectric liner 112. Furthermore, because an amount of the second etchant 2202 that reaches sidewalls of the dielectric liner 112 is mitigated, the second etchant 2202 forms a second TSV opening 2204 that extends through the dielectric liner 112 at a position that is separated from the sidewalls of the dielectric liner 112 by a non-zero distance d. The second TSV opening 2204 exposes a first interconnect of the plurality of interconnects 108.

Figure 23:
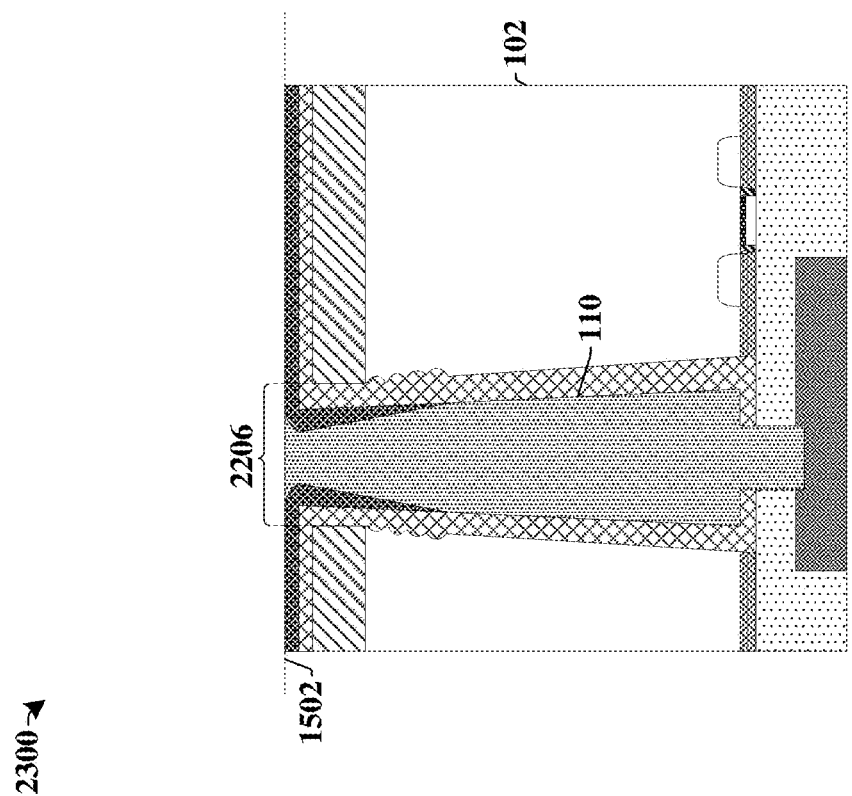

As shown in cross-sectional view 2300 of FIG. 23, a conductive material is formed within the TSV hole 2206. After forming the conductive material, a planarization process may be performed (along line 1502) to remove excess of the conductive material from over the etch blocking layer 302 and to define a through-substrate-via (TSV) 110 extending through the substrate 102.

Figure 24:
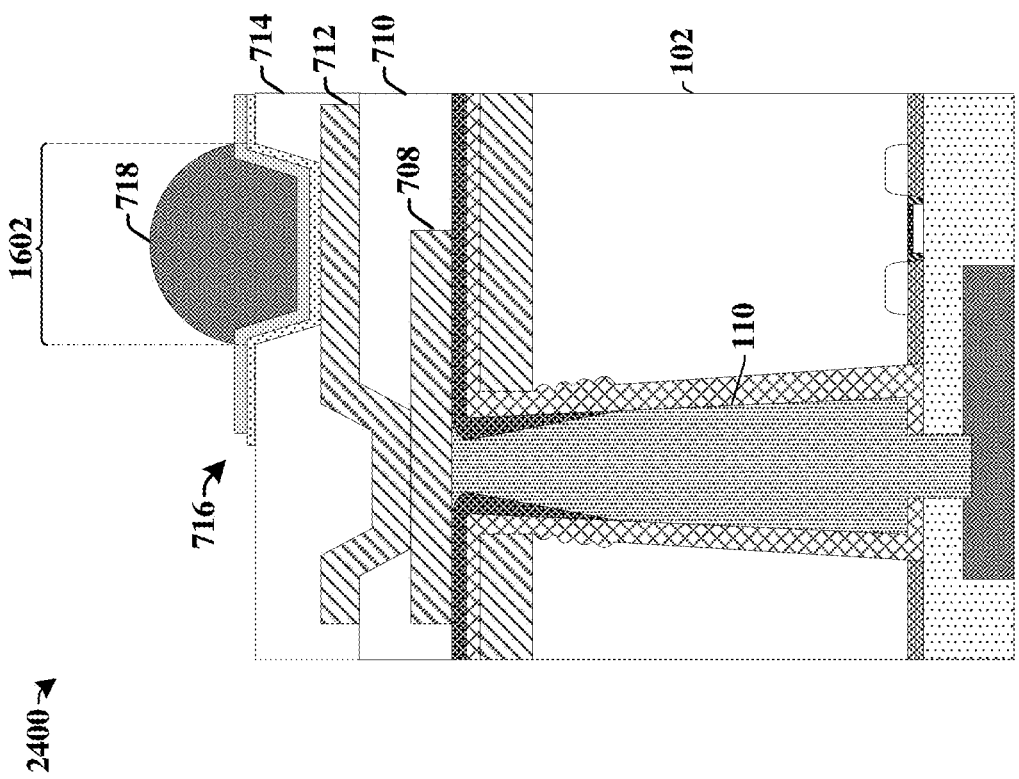

As shown in cross-sectional view 2400 of FIG. 24, a bond pad 708 is formed over the TSV 110. A first passivation layer 710 may be formed over the bond pad 708. One or more RDLs 712 are formed over the first passivation layer 710. In some embodiments, the one or more RDLs 712 may be formed by etching the first passivation layer 710 to expose the bond pad 708, and forming a second conductive material over the first passivation layer 710. A second passivation layer 714 is formed over the first passivation layer 710. The second passivation layer 714 is subsequently etched to form an UBM opening 1602 that exposes the one or more RDLs 712. An UBM structure 716 is formed within the UBM opening 1602.

FIGS. 25-32 illustrate cross-sectional views 2500-3200 of some additional embodiments of a method of forming an integrated chip having a TSV with a reentrant profile. Although FIGS. 25-32 are described in relation to a method, it will be appreciated that the structures disclosed in FIGS. 25-32 are not limited to such a method, but instead may stand alone as structures independent of the method.

Figure 25:
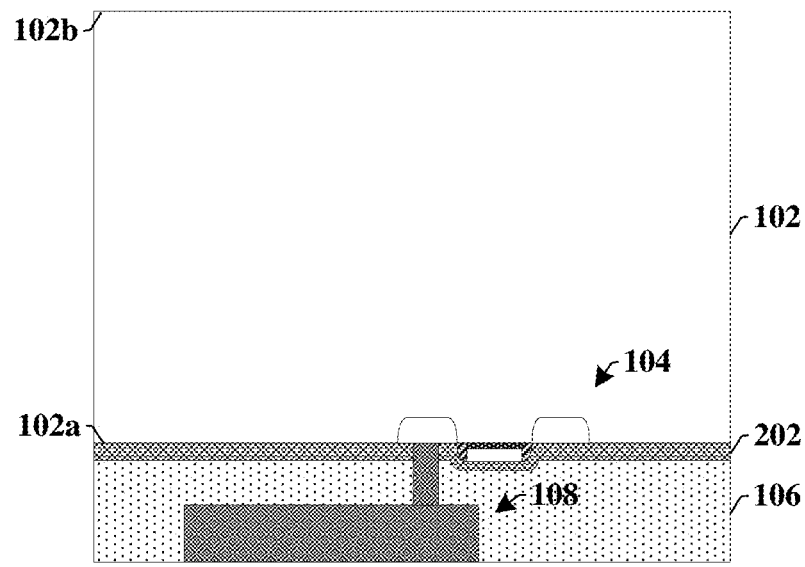
FIGS. 25-32 illustrate cross-sectional views of some additional embodiments of a method of forming an integrated chip having a TSV with a reentrant profile.

As shown in cross-sectional view 2500 of FIG. 25, one or more semiconductor devices 104 (e.g., a transistor device, an image sensor device, and/or the like) are formed on and/or within a first side 102a of a substrate 102. In some embodiments, a contact etch stop layer 202 is formed on the first side 102a of the substrate 102. A plurality of interconnects 108 may be formed within an ILD structure 106 formed on the contact etch stop layer 202.

Figure 26:
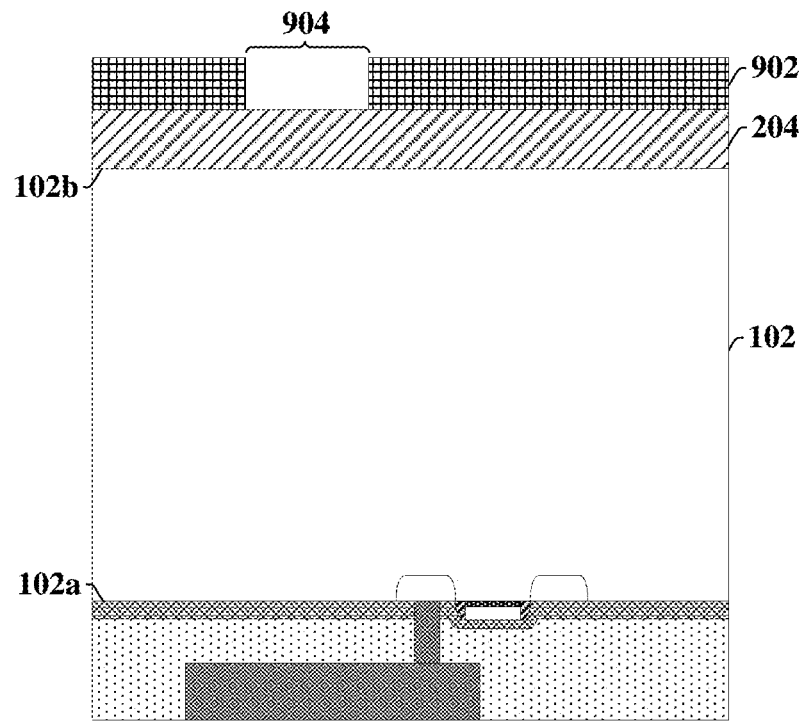

As shown in cross-sectional view 2600 of FIG. 26, a dielectric layer 204 is formed on a second side 102b of the substrate 102 opposing the first side 102a of the substrate 102. A masking layer 902 is formed over the dielectric layer 204. The masking layer 902 comprises one or more sidewalls defining an opening 904 exposing a part of the dielectric layer 204.

Figure 27:
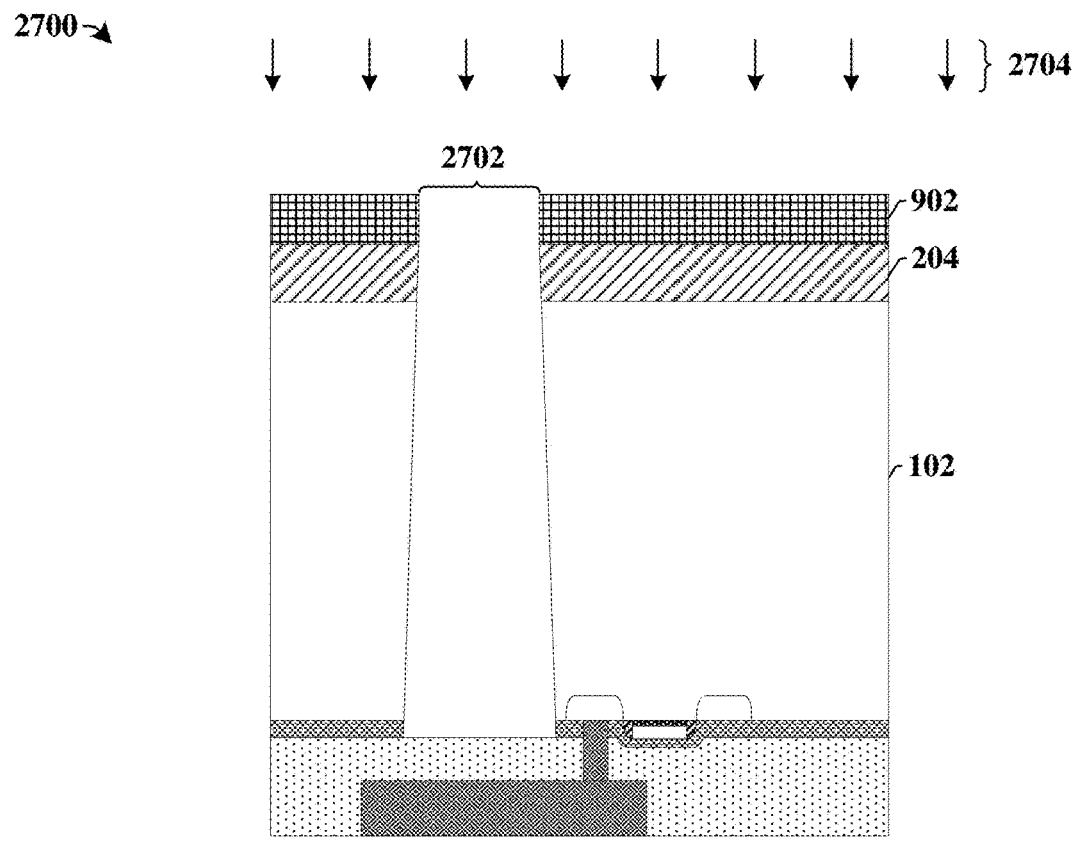

As shown in cross-sectional view 2700 of FIG. 27, a first etching process is performed to pattern the dielectric layer 204 and the substrate 102 according to the masking layer 902. The first etching process forms sidewalls of the substrate 102 that extend through the substrate and that define a first TSV opening 2702 (i.e., an intermediate TSV hole) extending through the substrate 102. In some embodiments, the first TSV opening 2702 also extends through the contact etch stop layer 202 to expose the ILD structure 106 arranged along the first side 102a of the substrate 102. The sidewalls are angled to give the first TSV opening 2702 a reentrant profile that increases in width as a distance from the second side 102b of the substrate 102 increases. In some embodiments, the first etching process is performed by exposing the substrate 102 to a first etchant 2704 according to the masking layer 902.

Figure 28:
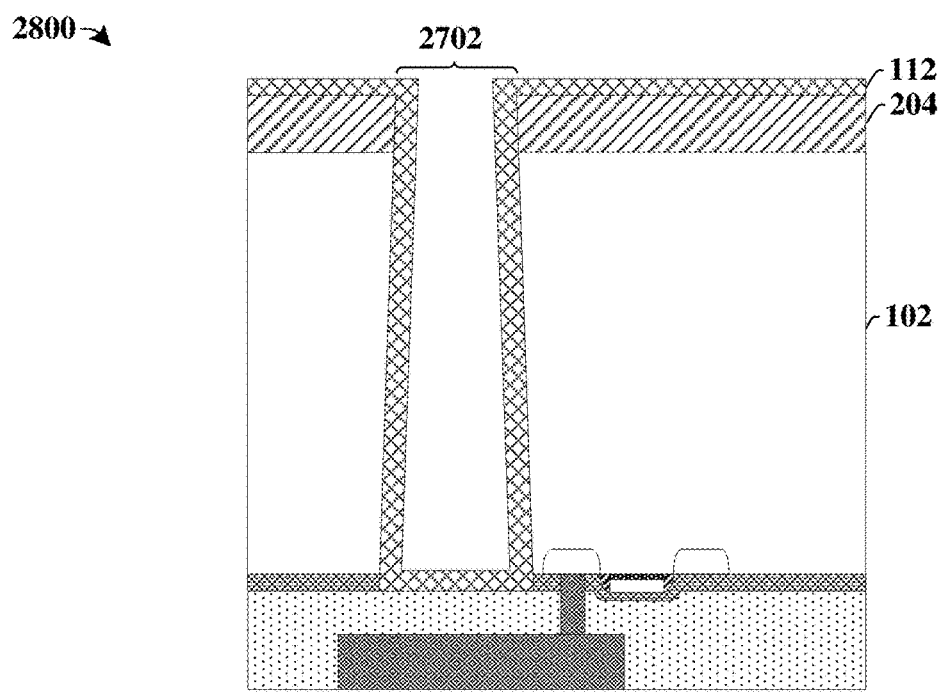

As shown in cross-sectional view 2800 of FIG. 28, a dielectric liner 112 is formed along surfaces defining the first TSV opening 2702. For example, the dielectric liner 112 may be formed along sidewalls of the substrate 102, the dielectric layer 204, and/or the ILD structure 106.

Figure 29:
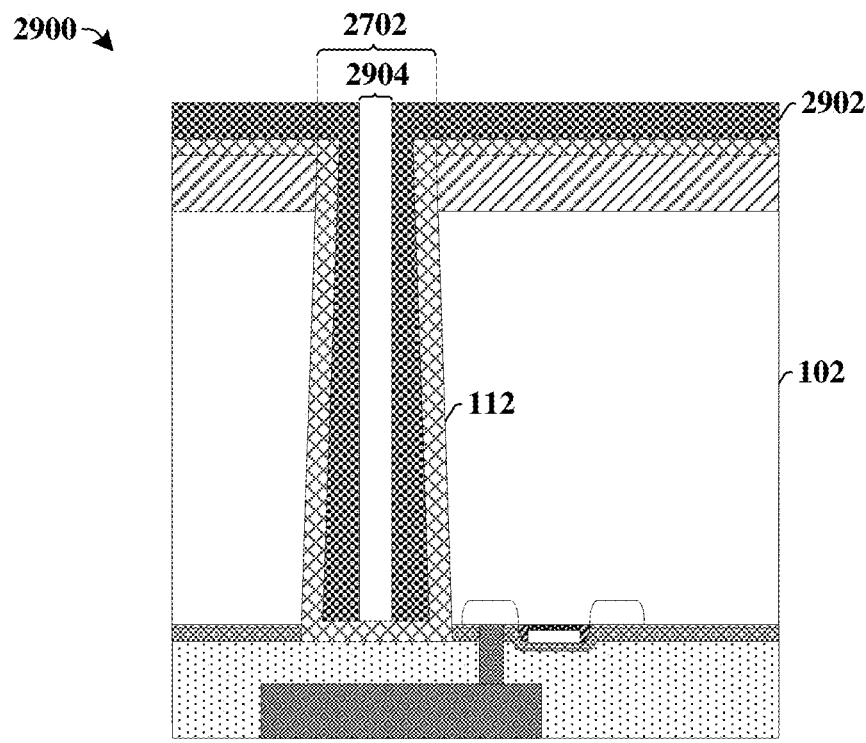

As shown in cross-sectional view 2900 of FIG. 29, an etch blocking layer 2902 is formed on the dielectric liner 112. The etch blocking layer 2902 may be formed along sidewalls of the dielectric liner 112 and on an upper surface of the dielectric liner 112 facing away from the substrate 102. In some embodiments, the etch blocking layer 2902 may comprise a photosensitive material. In some embodiments, the photosensitive material may be selectively patterned to define an opening 2904 that exposes a horizontally extending surface of the dielectric liner 112 that is within the first TSV opening 2702.

Figure 30:
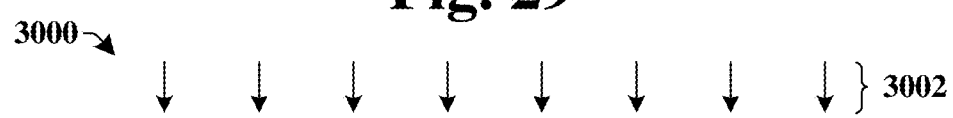

As shown in cross-sectional view 3000 of FIG. 30, a second etching process is performed to selectively etch the dielectric liner 112 and the ILD structure 106 according to the etch blocking layer 2902. The second etching process defines a TSV hole 3006 (comprising the first TSV opening (2702 of FIG. 29) and a second TSV opening 3004) that exposes one of the plurality of interconnects 108. In some embodiments, the second etching process exposes the dielectric liner 112 and the ILD structure 106 to a second etchant 3002 according to the etch blocking layer 2902. The etch blocking layer 2902 is removed after the second etching process is completed. In some embodiments, the etch blocking layer 2902 may be removed by a plasma ashing process.

Because of the reentrant profile of the first TSV opening (2702 of FIG. 29), the dielectric liner 112 and/or the substrate 102 overlies a part of the dielectric liner 112 and thereby prevent the second etchant 3002 from reaching the dielectric liner 112. Because the second etchant 3002 is not able to reach sidewall of the dielectric liner 112, the second etchant 3002 forms a second TSV opening 3004 that extends through the dielectric liner 112 at a position that is separated from sidewalls of the dielectric liner 112 by a non-zero distance d. The second TSV opening 3004 exposes a first interconnect of the plurality of interconnects 108.

Figure 31:
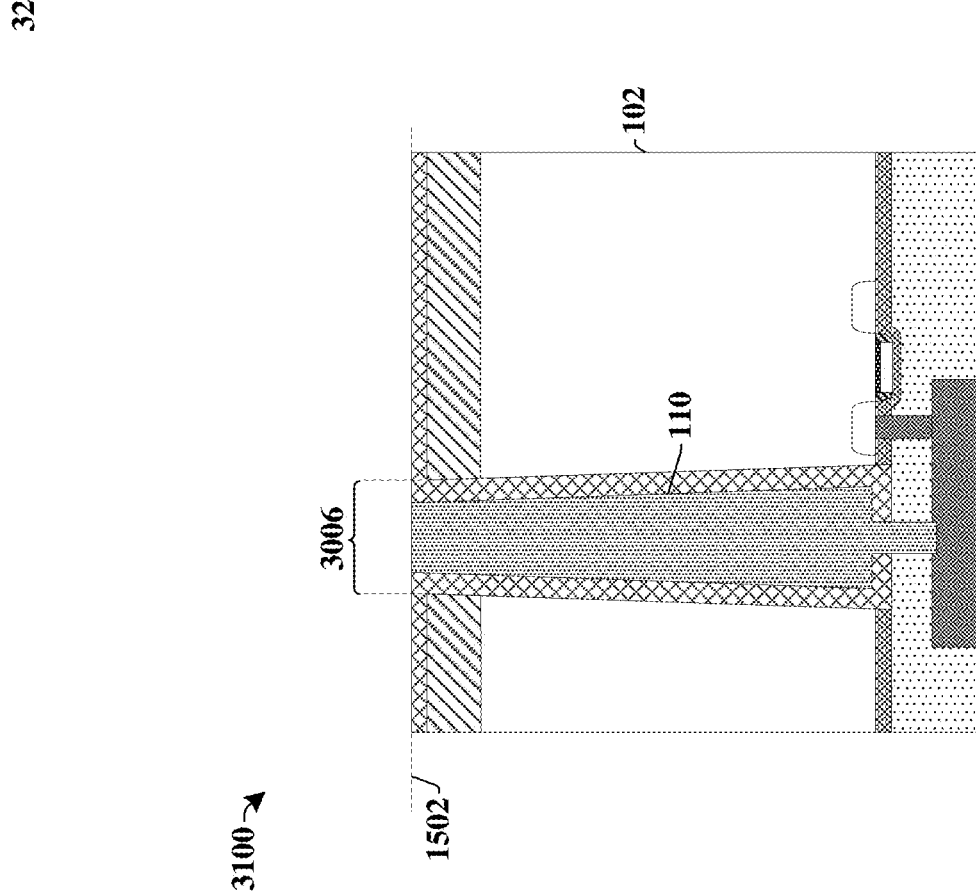

As shown in cross-sectional view 3100 of FIG. 31, a conductive material is formed within the TSV hole 3006. After forming the conductive material, a planarization process may be performed (along line 1502) to remove excess of the conductive material from over the dielectric liner 112 and to define a through-substrate-via (TSV) 110 extending through the substrate 102.

Figure 32:
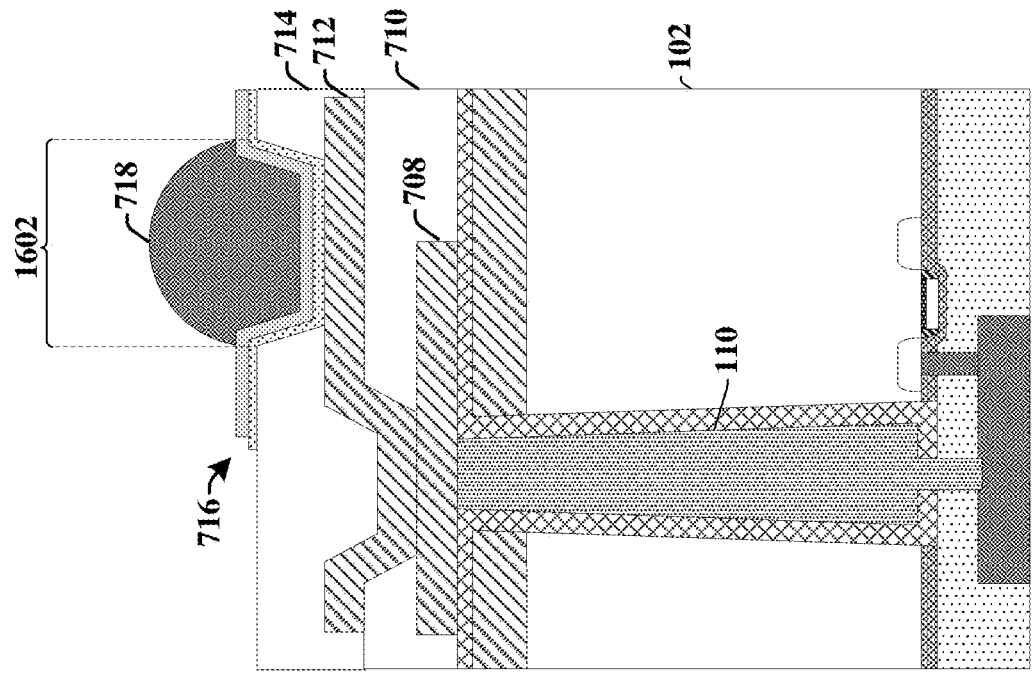

As shown in cross-sectional view 3200 of FIG. 32, a bond pad 708 is formed over the TSV 110. A first passivation layer 710 may be formed over the bond pad 708. One or more RDLs 712 are formed over the first passivation layer 710. In some embodiments, the one or more RDLs 712 may be formed by etching the first passivation layer 710 to expose the bond pad 708, and forming a second conductive material over the first passivation layer 710. A second passivation layer 714 is formed over the first passivation layer 710. The second passivation layer 714 is subsequently etched to form an UBM opening 1602 that exposes the one or more RDLs 712. An UBM structure 716 is formed within the UBM opening 1602.

Figure 33:
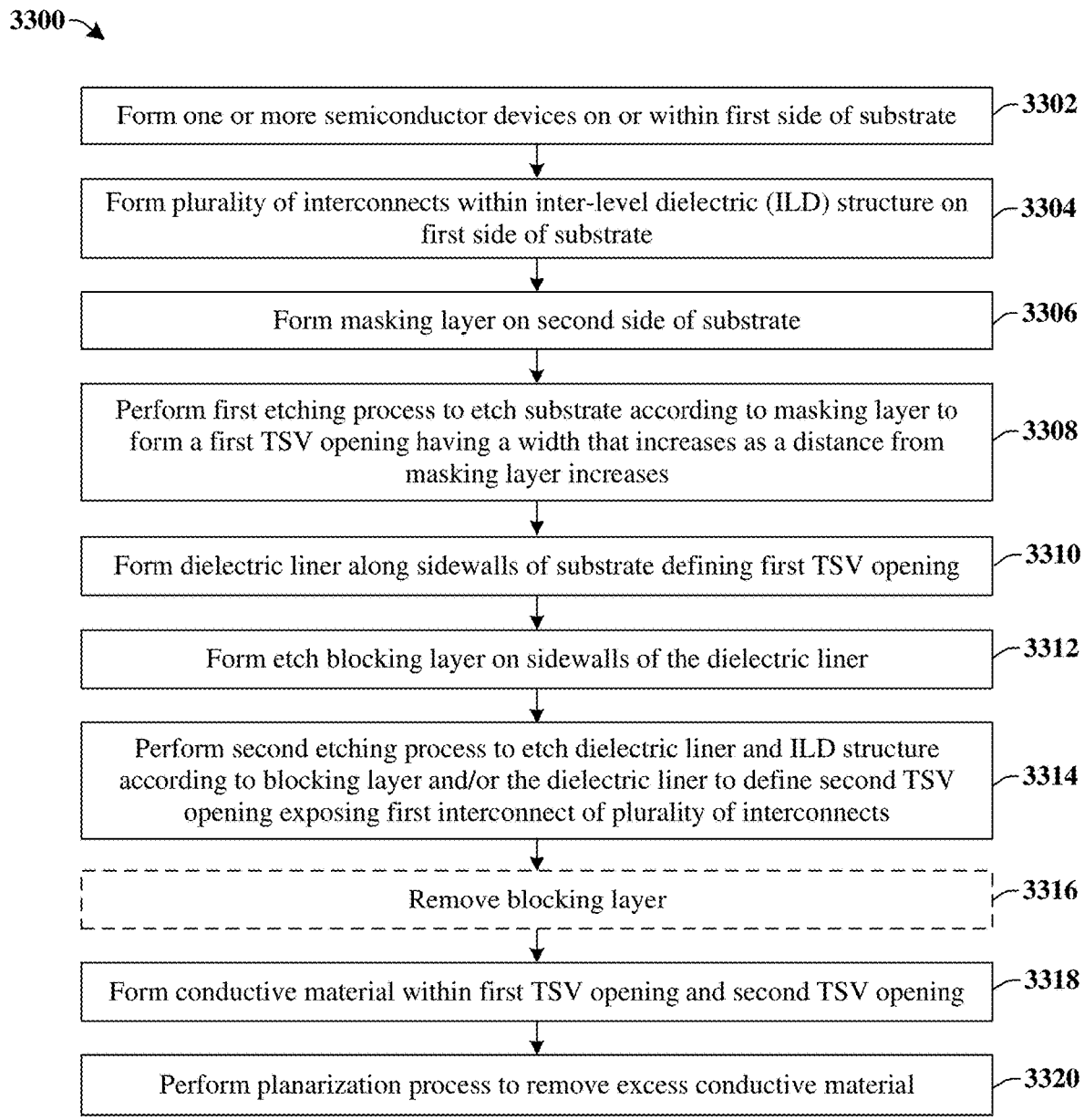
FIG. 33 illustrates a flow diagram of some embodiments of a method of forming an integrated chip having a TSV with a reentrant profile.

FIG. 33 illustrates a flow diagram of some embodiments of a method 3300 of forming an integrated chip having a TSV with a reentrant profile.

While the disclosed method 3300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3302, one or more semiconductor devices are formed on or within a first side of a substrate. FIG. 8 illustrates a cross-sectional view 800 of some embodiments corresponding to act 3302. FIG. 17 illustrates a cross-sectional view 1700 of some alternative embodiments corresponding to act 3302. FIG. 25 illustrates a cross-sectional view 2500 of some alternative embodiments corresponding to act 3302.

At act 3304, a plurality of interconnects are formed within an inter-level dielectric (ILD) structure formed on the first side of the substrate. FIG. 8 illustrates a cross-sectional view 800 of some embodiments corresponding to act 3304. FIG. 17 illustrates a cross-sectional view 1700 of some alternative embodiments corresponding to act 3304. FIG. 25 illustrates a cross-sectional view 2500 of some alternative embodiments corresponding to act 3304.

At act 3306, a masking layer is formed on a second side of the substrate. FIG. 9 illustrates a cross-sectional view 900 of some embodiments corresponding to act 3306. FIG. 18 illustrates a cross-sectional view 1800 of some alternative embodiments corresponding to act 3306. FIG. 26 illustrates a cross-sectional view 2600 of some alternative embodiments corresponding to act 3306.

At act 3308, a first etching process is performed to etch the substrate according to the masking layer to define a first TSV opening having a width that increases as a distance from the masking layer increases. FIG. 10 illustrates a cross-sectional view 1000 of some embodiments corresponding to act 3308. FIGS. 19A-19E illustrate cross-sectional views 1900 of some alternative embodiments corresponding to act 3308. FIG. 27 illustrates a cross-sectional view 2700 of some alternative embodiments corresponding to act 3308.

At act 3310, a dielectric liner is formed on sidewalls of the substrate defining the first TSV opening. FIG. 11 illustrates a cross-sectional view 1100 of some embodiments corresponding to act 3310. FIG. 20 illustrates a cross-sectional view 2000 of some alternative embodiments corresponding to act 3310. FIG. 28 illustrates a cross-sectional view 2800 of some alternative embodiments corresponding to act 3310.

At act 3312, an etch blocking layer is formed on sidewalls of the dielectric liner in some embodiments. FIG. 12 illustrates a cross-sectional view 1200 of some embodiments corresponding to act 3312. FIG. 21 illustrates a cross-sectional view 2100 of some alternative embodiments corresponding to act 3312. FIG. 29 illustrates a cross-sectional view 2900 of some alternative embodiments corresponding to act 3312.

At act 3314, a second etching process is performed to etch the dielectric liner and the ILD structure according to the etch blocking layer and/or the dielectric liner to define a second TSV opening exposing a first interconnect of the plurality of interconnects. FIG. 13 illustrates a cross-sectional view 1300 of some embodiments corresponding to act 3314. FIG. 22 illustrates a cross-sectional view 2200 of some alternative embodiments corresponding to act 3314. FIG. 30 illustrates a cross-sectional view 3000 of some alternative embodiments corresponding to act 3314.

At act 3316, the etch blocking layer may be removed in some embodiments. FIG. 31 illustrates a cross-sectional view 3100 of some embodiments corresponding to act 3316.

At act 3318, a conductive material is formed within the first TSV opening and the second TSV opening. FIG. 14 illustrates a cross-sectional view 1400 of some embodiments corresponding to act 3318. FIG. 23 illustrates a cross-sectional view 2300 of some alternative embodiments corresponding to act 3318. FIG. 31 illustrates a cross-sectional view 3100 of some alternative embodiments corresponding to act 3318.

At act 3320, a planarization process is performed to remove excess of the conductive material. FIG. 15 illustrates a cross-sectional view 1500 of some embodiments corresponding to act 3320. FIG. 23 illustrates a cross-sectional view 2300 of some alternative embodiments corresponding to act 3320. FIG. 31 illustrates a cross-sectional view 3100 of some alternative embodiments corresponding to act 3320.

Accordingly, in some embodiments, the present disclosure relates to an integrated chip having a through-substrate-via (TSV) (e.g., a back-side through substrate via (BTSV)) with a reentrant profile that is configured to prevent damage to a dielectric liner.

In some embodiments, the present disclosure relates to an integrated chip. The integrated chip includes a semiconductor device arranged along a first side of a semiconductor substrate, the semiconductor substrate including one or more sidewalls extending from the first side of the semiconductor substrate to an opposing second side of the semiconductor substrate; a dielectric liner lining the one or more sidewalls of the semiconductor substrate; a through-substrate-via (TSV) arranged between the one or more sidewalls and separated from the semiconductor substrate by the dielectric liner; and the TSV having a first width at a first distance from the second side and a second width at a second distance from the second side, the first width smaller than the second width and the first distance smaller than the second distance. In some embodiments, the dielectric liner continuously extends from along the one or more sidewalls of the semiconductor substrate to along the second side of the semiconductor substrate. In some embodiments, the dielectric liner includes a first sidewall and a second sidewall facing opposing sides of the TSV and a horizontally extending ledge protruding outward from the first sidewall and towards the second sidewall. In some embodiments, the integrated chip further includes an etch blocking layer arranged between the dielectric liner and sidewalls of the TSV, the etch blocking layer having a bottom that is separated from the horizontally extending ledge of the dielectric liner. In some embodiments, the etch blocking layer has a thickness that varies over a height of the etch blocking layer. In some embodiments, the etch blocking layer continuously extends from a sidewall of the dielectric liner to along the second side of the semiconductor substrate. In some embodiments, the TSV includes a horizontally extending surface facing away from the semiconductor substrate and a protrusion extending outward from the horizontally extending surface. In some embodiments, the integrated chip further includes a plurality of interconnects disposed within an inter-level dielectric (ILD) structure arranged along the first side of the semiconductor substrate, the protrusion extending through the ILD structure to contact one of the plurality of interconnects. In some embodiments, the one or more sidewalls of the semiconductor substrate are respectively defined by a plurality of curved depressions.

In other embodiments, the present disclosure relates to an integrated chip. The integrated chip includes a plurality of interconnects disposed within an inter-level dielectric (ILD) structure arranged along a first side of a substrate; a through-substrate-via (TSV) extending through the substrate; a dielectric liner separating the TSV from the substrate, the dielectric liner including a first sidewall and a second sidewall facing opposing sides of the TSV and a horizontally extending ledge protruding outward from the first sidewall and towards the second sidewall; and the TSV including a horizontally extending surface disposed on the horizontally extending ledge of the dielectric liner and a protrusion extending outward from the horizontally extending surface to one of the plurality of interconnects. In some embodiments, the dielectric liner continuously extends from along sidewalls of the substrate to along a second side of the substrate opposing the first side of the substrate. In some embodiments, the integrated chip further includes an etch blocking layer arranged between the dielectric liner and sidewalls of the TSV, the etch blocking layer vertically separated from the horizontally extending ledge of the dielectric liner by a non-zero distance. In some embodiments, the etch blocking layer includes an oxide or a nitride. In some embodiments, the etch blocking layer has sidewalls facing the TSV; and the sidewalls of the etch blocking layer are separated by a first distance and the protrusion has a width that is greater than or equal to the first distance. In some embodiments, the TSV has a top surface having a first width and a bottom surface having a second width; and the TSV has a maximum width that is vertically disposed between the top surface and the bottom surface, the maximum width being larger than the first width and the second width. In some embodiments, the first sidewall of the dielectric liner is separated from the horizontally extending ledge of the dielectric liner by an angle of between approximately 80° and approximately 90°. In some embodiments, the TSV has a first sidewall that is directly between sidewalls of the substrate and that has a first slope; and the TSV has a second sidewall that is directly between sidewalls of the ILD structure and that has a second slope that is larger than the first slope. In some embodiments, an imaginary vertical line that is perpendicular to the first side of the substrate extends through the TSV and through the dielectric liner.

In other embodiments, the present disclosure relates to a method of forming an integrated chip. The method includes forming a plurality of interconnects within an inter-level dielectric (ILD) structure along a first side of a substrate; forming a masking layer on a second side of the substrate opposing the first side; performing a first etching process to etch the substrate according to the masking layer and to form sidewalls of the substrate that define a first through-substrate-via (TSV) opening extending through the substrate, the first TSV opening having a width that increases as a distance from the masking layer increases; forming a dielectric liner along the sidewalls of the substrate and on the ILD structure; performing a second etching process on the dielectric liner and the ILD structure to form a second TSV opening exposing one of the plurality of interconnects, the second TSV opening being separated from a sidewall of the dielectric liner by a non-zero distance; and forming a conductive material within the first TSV opening and the second TSV opening. In some embodiments, the method further includes forming an etch blocking layer on sidewalls of the dielectric liner, the second etching process etching the dielectric liner and the ILD structure according to the etch blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a semiconductor device arranged along a first side of a semiconductor substrate, wherein the semiconductor substrate comprises one or more sidewalls extending from the first side of the semiconductor substrate to an opposing second side of the semiconductor substrate;
a dielectric liner lining the one or more sidewalls of the semiconductor substrate;
a through-substrate-via (TSV) arranged between the one or more sidewalls and separated from the semiconductor substrate by the dielectric liner; and
wherein the dielectric liner has sidewalls that slope inward towards one another from an upper surface of the dielectric liner arranged directly below the TSV to a topmost surface of the dielectric liner over the one or more sidewalls of the semiconductor substrate, so that the dielectric liner overhangs the TSV in a cross-sectional view.

2. The integrated chip of claim 1, wherein the TSV continuously contacts the sidewalls of the dielectric liner between the first side and the second side of the semiconductor substrate.

3. The integrated chip of claim 1, wherein the dielectric liner comprises a first sidewall and a second sidewall facing opposing sides of the TSV and a horizontally extending ledge protruding outward from the first sidewall and towards the second sidewall.

4. The integrated chip of claim 3, further comprising:
an etch blocking layer arranged between the dielectric liner and sidewalls of the TSV, wherein the etch blocking layer has a bottom that is separated from the horizontally extending ledge of the dielectric liner.

5. The integrated chip of claim 4, further comprising:
an etch blocking layer remnant disposed along the upper surface and one of the sidewalls of the dielectric liner, the etch blocking layer being separated from the etch blocking layer remnant by the TSV.

6. The integrated chip of claim 4, further comprising:
a dielectric layer disposed between the second side of the semiconductor substrate and a lower surface of the dielectric liner facing the second side of the semiconductor substrate, wherein the TSV has a minimum width over a top of the dielectric layer facing away from the semiconductor substrate.

7. The integrated chip of claim 1, wherein the upper surface of the dielectric liner is parallel to the first side of the semiconductor substrate.

8. The integrated chip of claim 7, further comprising:
a plurality of interconnects disposed within an inter-level dielectric (ILD) structure arranged along the first side of the semiconductor substrate,
wherein the TSV comprises a horizontally extending surface facing away from the semiconductor substrate and a protrusion extending outward from the horizontally extending surface, the protrusion extending through the ILD structure to contact one of the plurality of interconnects.

9. The integrated chip of claim 1, wherein the one or more sidewalls of the semiconductor substrate are respectively defined by a plurality of curved depressions.

10. An integrated chip, comprising:
a plurality of interconnects disposed within an inter-level dielectric (ILD) structure arranged along a first side of a substrate;
an etch stop layer arranged along the first side of the substrate;
a through-substrate-via (TSV) extending through the substrate and the etch stop layer;
a dielectric liner separating the TSV from the substrate, wherein the dielectric liner is along sidewalls of the substrate and the etch stop layer and wherein the dielectric liner comprises a first sidewall and a second sidewall facing opposing sides of the TSV and a horizontally extending ledge protruding outward from the first sidewall and towards the second sidewall; and
wherein the TSV comprises a horizontally extending surface disposed on the horizontally extending ledge of the dielectric liner and a protrusion extending outward from the horizontally extending surface to one of the plurality of interconnects.

11. The integrated chip of claim 10, wherein the dielectric liner continuously extends from along the sidewalls of the substrate to along a second side of the substrate opposing the first side of the substrate.

12. The integrated chip of claim 10, further comprising:
an etch blocking layer arranged between the dielectric liner and sidewalls of the TSV, wherein the etch blocking layer is vertically separated from the horizontally extending ledge of the dielectric liner by a non-zero distance.

13. The integrated chip of claim 12, wherein the protrusion of the TSV has a width that is larger than a minimum distance between interior sidewalls of the etch blocking layer that face one another.

14. The integrated chip of claim 12,
wherein the etch blocking layer has sidewalls facing the TSV; and
wherein the sidewalls of the etch blocking layer are separated by a first distance and the protrusion has a width that is greater than or equal to the first distance.

15. The integrated chip of claim 10, wherein the dielectric liner extends from along the sidewalls of the substrate to a top of the TSV.

16. The integrated chip of claim 10, wherein the first sidewall of the dielectric liner is separated from the horizontally extending ledge of the dielectric liner by an angle of between approximately 80° and approximately 90°.

17. The integrated chip of claim 10,
wherein the TSV has a first sidewall that is directly between the sidewalls of the substrate and that has a first slope; and
wherein the TSV has a second sidewall that is directly between sidewalls of the ILD structure and that has a second slope that is larger than the first slope.

18. A method of forming an integrated chip, comprising:
forming a plurality of interconnects within an inter-level dielectric (ILD) structure along a first side of a substrate;
forming a masking layer on a second side of the substrate opposing the first side;
performing a first etching process to etch the substrate according to the masking layer and to form sidewalls of the substrate that define a first through-substrate-via (TSV) opening extending through the substrate, wherein the first TSV opening has a width that increases as a distance from the masking layer increases;
forming a dielectric liner along the sidewalls of the substrate and on the ILD structure;
performing a second etching process on the dielectric liner and the ILD structure to form a second TSV opening exposing one of the plurality of interconnects, wherein the second TSV opening is separated from a sidewall of the dielectric liner by a non-zero distance; and
forming a through-substrate-via (TSV) within the first TSV opening and the second TSV opening, wherein the dielectric liner has sidewalls that slope inward towards one another from an upper surface of the dielectric liner arranged directly below the TSV to a topmost surface of the dielectric liner over the sidewalls of the substrate, as viewed in a cross-sectional view.

19. The method of claim 18, further comprising:
forming an etch blocking layer on the sidewalls of the dielectric liner, wherein the second etching process etches the dielectric liner and the ILD structure according to the etch blocking layer; and
wherein an etch blocking layer remnant is disposed along the upper surface and one of the sidewalls of the dielectric liner after forming the etch blocking layer, the etch blocking layer being separated from the etch blocking layer remnant by the TSV.

20. The method of claim 18, further comprising:
forming an etch stop layer along the first side of the substrate, wherein the first etching process etches through the etch stop layer so that the first TSV opening is formed by the sidewalls of the substrate and the etch stop layer.

* * * * *